United States Patent
Iida

(10) Patent No.: US 7,792,198 B2
(45) Date of Patent: Sep. 7, 2010

(54) BURST CONTROL PULSE GENERATING CIRCUIT

(75) Inventor: Izumi Iida, Shiojiri (JP)

(73) Assignee: Seiko Epson Corporation (JP)

( * ) Notice: Subject to any disclaimer, the term of this patent is extended or adjusted under 35 U.S.C. 154(b) by 540 days.

(21) Appl. No.: 11/851,068

(22) Filed: Sep. 6, 2007

(65) Prior Publication Data

US 2008/0063044 A1 Mar. 13, 2008

(30) Foreign Application Priority Data

| Sep. 7, 2006 | (JP) | ............................. 2006-242418 |
| Jun. 28, 2007 | (JP) | ............................. 2007-170080 |

(51) Int. Cl.
*H04L 27/00* (2006.01)

(52) U.S. Cl. .................. 375/259; 375/295; 375/309; 375/316

(58) Field of Classification Search ................. 375/259, 375/295, 309, 316
See application file for complete search history.

(56) References Cited

U.S. PATENT DOCUMENTS

| 3,813,496 | A | * | 5/1974 | Maillet ....................... 370/324 |
| 4,485,478 | A | * | 11/1984 | Takada ........................ 375/296 |
| 4,866,761 | A | * | 9/1989 | Thornborough et al. ..................... 379/106.04 |

FOREIGN PATENT DOCUMENTS

| JP | 2005-217899 | 8/2005 |
| JP | 2007-081656 | 3/2007 |

* cited by examiner

*Primary Examiner*—Ted M Wang
(74) *Attorney, Agent, or Firm*—Harness, Dickey & Pierce, P.L.C.

(57) ABSTRACT

A burst control pulse generating circuit which generates a pulse signal used to provide communication includes a timing generating circuit containing a ring oscillation circuit which oscillates a periodic signal based on a burst signal for controlling the ON and OFF condition of the communication to output a plurality of timing signals based on the periodic signal, and a pulse generating logic circuit which generates the pulse signal based on the plural timing signals. The burst control pulse generating circuit generates the pulse signal one or more times when the burst signal is in an ON condition, and stops generation of the pulse signal when the burst signal is in an OFF condition.

17 Claims, 18 Drawing Sheets

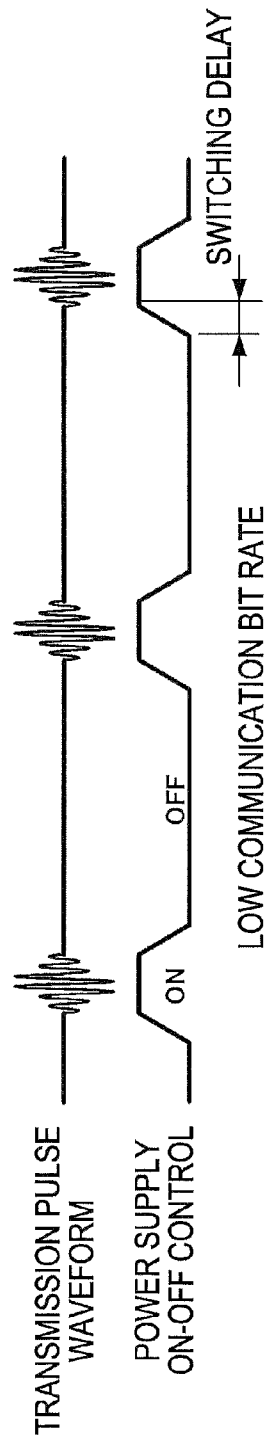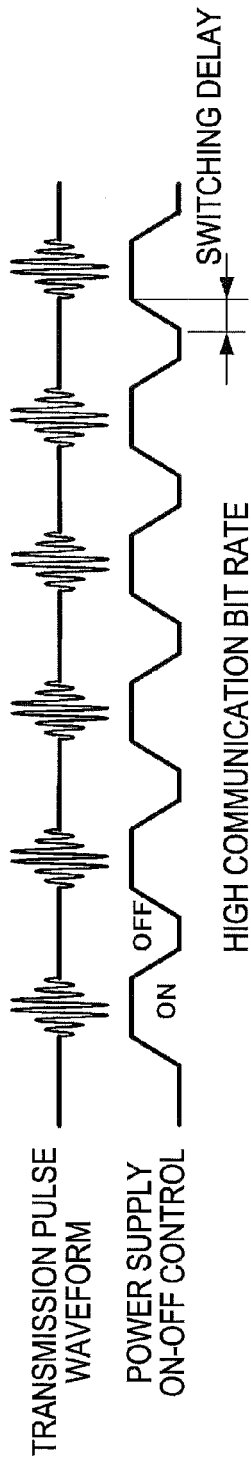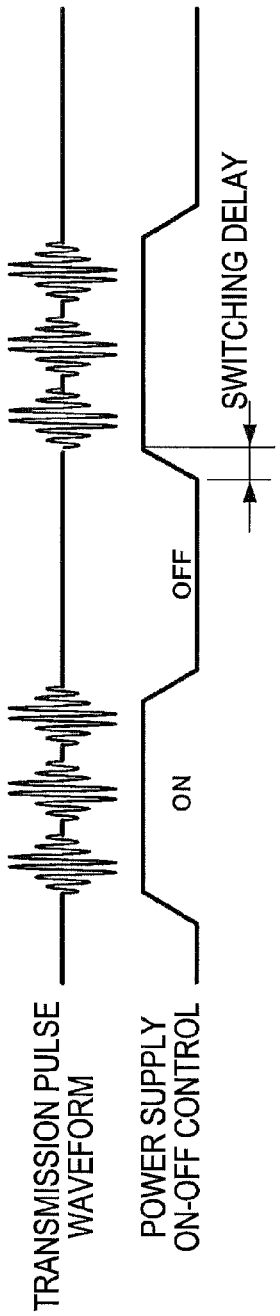

PPM MODULATING CIRCUIT

OOK MODULATING CIRCUIT

BPM MODULATING CIRCUIT

BURST CONTROL PULSE GENERATING CIRCUIT

RELATED APPLICATIONS

This application claims priority to Japanese Patent Application Nos. 2006-242418 filed Sep. 7, 2006 and 2007-170080 filed Jun. 28, 2007 which are hereby expressly incorporated by reference herein in their entirety.

BACKGROUND

1. Technical Field

A burst control pulse generating circuit is provided which generates a pulse used to provide communication, and also a digital modulating circuit and an electronic device are provided including a burst control pulse generating circuit.

2. Related Art

UWB (ultra wide band) communication is a communication system which provides high-speed and large-volume data communication using an extremely wide frequency band. Other communication systems based on wideband signals use methods such as spectrum spread and orthogonal frequency division multiplex (OFDM). However, the UWB is a communication system having a broader band and using an extremely short time pulse, and also is called impulse radio (IR) system communication. According to the IR system, modulation and demodulation can be executed not by related-art modulation methods but only by time base operation. Thus, it is currently expected that this system will achieve both simplification of circuit structure and reduction of power consumption.

In order to provide these advantages, JP-A-2005-217899 discloses a method for reducing power consumption by ON-OFF control over an amplifier of a receiver in the UWB pulse communication.

According to this technology, however, no consideration is given to delay of ON-OFF switching. When the communication bit rate is low as shown in FIG. 1A, the effect of ON-OFF switching delay is not serious. However, when the communication bit rate is high as shown in FIG. 1B, the proportion taken up by additional power consumption produced by ON-OFF switching delay in the total power consumption increases.

SUMMARY

Some aspects of the invention provide a burst control pulse generating circuit, and a digital modulating circuit and an electronic device including a burst control pulse generating circuit, which can solve at least a part of the problems described above by employing structures according to the following examples or applications.

A burst control pulse generating circuit which generates a pulse signal used to provide communication according to a first aspect of the invention includes a timing generating circuit containing a ring oscillation circuit which oscillates a periodic signal based on a burst signal for controlling an ON and OFF condition of the communication to output a plurality of timing signals based on the periodic signal, and a pulse generating logic circuit which generates the pulse signal based on the plural timing signals. The burst control pulse generating circuit generates the pulse signal one or more times when the burst signal is in the ON condition, and stops generation of the pulse signal when the burst signal is in the OFF condition.

According to this structure, the burst control pulse generating circuit generates the pulse signal one or more times when the burst signal is in the ON condition, and stops generation of the pulse signal when the burst signal is in the OFF condition. Thus, substantial reduction of the effect of ON-OFF switching delay and decrease in power consumption can be achieved.

In the burst control pulse generating circuit according to the first aspect of the invention, it is preferable that the oscillation period of the periodic signal oscillated from the ring oscillation circuit is longer than the pulse width of the pulse signal.

According to this structure, the burst control pulse generating circuit generates the pulse signal one or more times when the burst signal is in the ON condition, and stops generation of the pulse signal when the burst signal is in the OFF condition. Thus, substantial reduction of the effect of ON-OFF switching delay and decrease in power consumption can be achieved.

In the burst control pulse generating circuit according to the first aspect of the invention, it is preferable that the ring oscillation circuit shares at least one constituent element with the timing generating circuit.

According to this structure, the frequency of the pulse generating circuit and the period of the ring oscillation circuit can be simultaneously controlled by adjusting the element shared by the pulse generating circuit and the ring oscillation circuit. Thus, more accurate adjustment can be made than in the case of separate control over these components. Also, the circuit size can be decreased.

In the burst control pulse generating circuit according to the first aspect of the invention, it is preferable that the ring oscillation circuit contains a logic circuit adapted to control the oscillation period of the periodic signal.

According to this structure, the burst control pulse generating circuit generates the pulse signal one or more times when the burst signal is in the ON condition, and stops generation of the pulse signal when the burst signal is in the OFF condition. Thus, substantial reduction of the effect of ON-OFF switching delay and decrease in power consumption can be achieved. Moreover, since the period width of the ring oscillation circuit can be varied by the logic circuit adapted to control the delay time, the period width can be optimized in accordance with the effect of transmission paths such as multi paths and the effect of group delay characteristics of filter, antenna and the like.

In the burst control pulse generating circuit according to the first aspect of the invention, it is preferable that the timing generating circuit contains a logic circuit adapted to control the timing signals.

According to this structure, the burst control pulse generating circuit generates the pulse signal one or more times when the burst signal is in the ON condition, and stops generation of the pulse signal when the burst signal is in the OFF condition. Thus, substantial reduction of the effect of ON-OFF switching delay and decrease in power consumption can be achieved. Moreover, since the period width of the ring oscillation circuit can be varied by the logic circuit adapted to control the delay time, the period width can be optimized in accordance with the effect of transmission paths such as multi paths and the effect of group delay characteristics of filter, antenna and the like. Furthermore, the modulating frequency of the outputted pulse signal can be successively varied by the logic circuit adapted to control the delay time with the period width of the ring oscillation circuit fixed.

In the burst control pulse generating circuit according to the first aspect of the invention, it is preferable that the ring oscillation circuit contains a two-input logic circuit, and n (n being natural numbers ≧2) NOT circuits connected in series with the output pin of the two-input logic circuit. In this case, the output pin of the nth NOT circuit is connected with one input pin of the two-input logic circuit, and the burst signal is inputted to the other input pin of the two-input logic circuit. In addition, the timing generating circuit contains the ring oscillation circuit, and m (m being natural numbers ≦n) NOT circuits connected in series with the output pin of the nth NOT circuit.

According to this structure, the burst control pulse generating circuit generates the pulse signal one or more times when the burst signal is in the ON condition, and stops generation of the pulse signal when the burst signal is in the OFF condition. Thus, substantial reduction of the effect of ON-OFF switching delay and decrease in power consumption can be achieved.

In the burst control pulse generating circuit according to the first aspect of the invention, it is preferable that the ring oscillation circuit contains a two-input logic circuit, and n (n≧2) NOT circuits connected in series with the output pin of the two-input logic circuit. In this case, the timing generating circuit contains the ring oscillation circuit, and 2×m (m≦n÷2) NOT circuits connected in series with the output pin of the nth NOT circuit. A switching circuit which switches connection with the output pin of the n+(2×i)th (i being integers in the range of 0≦i≦m) NOT circuit is connected with one input of the two-input logic circuit. The burst signal is inputted to the other input pin of the two-input logic circuit.

According to this structure, the burst control pulse generating circuit generates the pulse signal one or more times when the burst signal is in the ON condition, and stops generation of the pulse signal when the burst signal is in the OFF condition. Thus, substantial reduction of the effect of ON-OFF switching delay and decrease in power consumption can be achieved. Moreover, since the period width of the ring oscillation circuit can be varied by the switching circuit, the period width can be optimized in accordance with the effect of transmission paths such as multi paths and the effect of group delay characteristics of filter, antenna and the like.

In the burst control pulse generating circuit according to the first aspect of the invention, it is preferable that the ring oscillation circuit contains a two-input logic circuit, and n (n≧2) NOT circuits connected in series with the output pin of the two-input logic circuit. In this case, the output pin of the nth NOT circuit is connected with one input pin of the two-input logic circuit, and the burst signal is inputted to the other input pin of the two-input logic circuit. In addition, the timing generating circuit contains the ring oscillation circuit, and n+m (m≦n) delay control NOT circuits adapted to control delay time based on a delay control signal and connected in series with the output pin of the two-input logic circuit.

According to this structure, the burst control pulse generating circuit generates the pulse signal one or more times when the burst signal is in the ON condition, and stops generation of the pulse signal when the burst signal is in the OFF condition. Thus, substantial reduction of the effect of ON-OFF switching delay and decrease in power consumption can be achieved. Moreover, the modulating frequency of the outputted pulse signal can be successively varied by the delay control signal with the period width of the ring oscillation circuit fixed.

In the burst control pulse generating circuit according to the first aspect of the invention, it is preferable that the ring oscillation circuit contains a two-input logic circuit, n (n≧2) delay control NOT circuits adapted to control delay time based on a delay control signal and connected in series with the output pin of the two-input logic circuit, and a delay circuit. In this case, the output pin of the nth delay control NOT circuit is connected with one input pin of the two-input logic circuit via the delay circuit, and the burst signal is inputted to the other input pin of the two-input logic circuit. In addition, the timing generating circuit contains the ring oscillation circuit.

According to this structure, the burst control pulse generating circuit generates the pulse signal one or more times when the burst signal is in the ON condition, and stops generation of the pulse signal when the burst signal is in the OFF condition. Thus, substantial reduction of the effect of ON-OFF switching delay and decrease in power consumption can be achieved. Moreover, the period width of the outputted pulse signal can be successively varied by the delay control signal with the intervals of the outputted pulse signal fixed.

A digital modulating circuit according to a second aspect of the invention includes: the burst control pulse generating circuit described above; a parallel/serial converting circuit; and a switching circuit which outputs the pulse signal generated from the burst control pulse generating circuit via a delay circuit when a serial signal outputted from the parallel/serial converting circuit is a first voltage, and outputs the pulse signal when the serial signal is a second voltage different from the first voltage. The digital modulating circuit applies PPM (pulse position modulation) to an inputted parallel signal and outputs the modulated parallel signal.

According to this structure, the digital modulating circuit applies PPM to an inputted parallel signal and outputs the modulated parallel signal when the burst signal is in the ON condition, and stops the output when the burst signal is in the OFF condition. Thus, substantial reduction of the effect of ON-OFF switching delay and decrease in power consumption can be achieved.

A digital modulating circuit according to a third aspect of the invention includes: the burst control pulse generating circuit described above; a parallel/serial converting circuit; and a switching circuit which outputs the pulse signal generated from the burst control pulse generating circuit when a serial signal outputted from the parallel/serial converting circuit is a first voltage, and cuts the output of the pulse signal when the serial signal is a second voltage different from the first voltage. The digital modulating circuit applies OOK (on-off keying) modulation to an inputted parallel signal and outputs the modulated parallel signal.

According to this structure, the digital modulating circuit applies OOK modulation to an inputted parallel signal and outputs the modulated parallel signal when the burst signal is in the ON condition, and stops the output when the burst signal is in the OFF condition. Thus, substantial reduction of the effect of ON-OFF switching delay and decrease in power consumption can be achieved.

A digital modulating circuit according to a fourth aspect of the invention includes: the burst control pulse generating circuit described above; a parallel/serial converting circuit; and a switching circuit which outputs the pulse signal generated from the burst control pulse generating circuit via a delay circuit when a serial signal outputted from the parallel/serial converting circuit is a first voltage, and outputs the pulse signal via a NOT circuit when the serial signal is a second voltage different from the first voltage. The digital modulating circuit applies BPM (bi-phase modulation) to an inputted parallel signal and outputs the modulated parallel signal.

According to this structure, the digital modulating circuit applies BPM to an inputted parallel signal and outputs the modulated parallel signal when the burst signal is in the ON condition, and stops the output when the burst signal is in the OFF condition. Thus, substantial reduction of the effect of ON-OFF switching delay and decrease in power consumption can be achieved.

A digital modulating circuit according to a fifth aspect of the invention includes: a first burst control pulse generating circuit and a second burst control pulse generating circuit as the burst control pulse generating circuit described above; a parallel/serial converting circuit; and a switching circuit which outputs the pulse signal generated from the first burst control pulse generating circuit when a serial signal outputted from the parallel/serial converting circuit is a first voltage, and outputs the pulse signal generated from the second burst control pulse generating circuit when the serial signal is a second voltage different from the first voltage. The digital modulating circuit applies FSK (frequency shift keying) modulation to an inputted parallel signal and outputs the modulated parallel signal.

According to this structure, the digital modulating circuit applies FSK modulation to an inputted parallel signal and outputs the modulated parallel signal when the burst signal is in the ON condition, and stops the output when the burst signal is in the OFF condition. Thus, substantial reduction of the effect of ON-OFF switching delay and decrease in power consumption can be achieved.

An electronic device according to a sixth aspect of the invention includes a burst control pulse generating circuit containing: a timing generating circuit having a ring oscillation circuit which oscillates a periodic signal based on a burst signal for controlling an ON and OFF condition of communication to output a plurality of timing signals based on the periodic signal; and a pulse generating logic circuit which generates a pulse signal used to provide communication based on the plural timing signals. The burst control pulse generating circuit generates the pulse signal one or more times when the burst signal is in the ON condition, and stops generation of the pulse signal when the burst signal is in the OFF condition. The oscillation period of the periodic signal oscillated from the ring oscillation circuit is longer than the pulse width of the pulse signal. The electronic device further includes: a parallel/serial converting circuit; a switching circuit which outputs the pulse signal generated from the burst control pulse generating circuit via a delay circuit when a serial signal outputted from the parallel/serial converting circuit is a first voltage, and outputs the pulse signal when the serial signal is a second voltage different from the first voltage; a transmitting device containing a digital modulating circuit which applies PPM (pulse position modulation) to an inputted parallel signal and outputs the modulated parallel signal; and a receiving device containing the burst control pulse generating circuit.

According to this structure, the electronic device applies PPM to an inputted parallel signal and outputs the modulated parallel signal when the burst signal is in the ON condition, and stops the output when the burst signal is in the OFF condition. Thus, substantial reduction of the effect of ON-OFF switching delay and decrease in power consumption can be achieved.

An electronic device according to a seventh aspect of the invention includes a burst control pulse generating circuit containing: a timing generating circuit having a ring oscillation circuit which oscillates a periodic signal based on a burst signal for controlling an ON and OFF condition of communication to output a plurality of timing signals based on the periodic signal; and a pulse generating logic circuit which generates a pulse signal used to provide communication based on the plural timing signals. The burst control pulse generating circuit generates the pulse signal one or more times when the burst signal is in the ON condition, and stops generation of the pulse signal when the burst signal is in the OFF condition. The oscillation period of the periodic signal oscillated from the ring oscillation circuit is longer than the pulse width of the pulse signal. The electronic device further includes: a parallel/serial converting circuit; a switching circuit which outputs the pulse signal generated from the burst control pulse generating circuit via a delay circuit when a serial signal outputted from the parallel/serial converting circuit is a first voltage, and outputs the pulse signal via a NOT circuit when the serial signal is a second voltage different from the first voltage; a transmitting device containing a digital modulating circuit which applies BPM (bi-phase modulation) to an inputted parallel signal and outputs the modulated parallel signal; and a receiving device containing the burst control pulse generating circuit.

According to this structure, the electronic device applies BPM modulation to an inputted parallel signal and outputs the modulated parallel signal when the burst signal is in the ON condition, and stops the output when the burst signal is in the OFF condition. Thus, substantial reduction of the effect of ON-OFF switching delay and decrease in power consumption can be achieved.

An electronic device according to an eighth aspect of the invention includes: a burst control pulse generating circuit containing: a timing generating circuit having a ring oscillation circuit which oscillates a periodic signal based on a burst signal for controlling an ON and OFF condition of communication to output a plurality of timing signals based on the periodic signal; and a pulse generating logic circuit which generates a pulse signal used to provide communication based on the plural timing signals. The burst control pulse generating circuit generates the pulse signal one or more times when the burst signal is in the ON condition, and stops generation of the pulse signal when the burst signal is in the OFF condition. The oscillation period of the periodic signal oscillated from the ring oscillation circuit is longer than the pulse width of the pulse signal. The electronic device further includes: a parallel/serial converting circuit; a switching circuit which outputs the pulse signal generated from the burst control pulse generating circuit when a serial signal outputted from the parallel/serial converting circuit is a first voltage, and cuts the output of the pulse signal when the serial signal is a second voltage different from the first voltage; a transmitting device containing a digital modulating circuit which applies OOK (on-off keying) modulation to an inputted parallel signal and outputs the modulated parallel signal; and a receiving device.

According to this structure, the electronic device applies OOK modulation to an inputted parallel signal and outputs the modulated parallel signal when the burst signal is in the ON condition, and stops the output when the burst signal is in the OFF condition. Thus, substantial reduction of the effect of ON-OFF switching delay and decrease in power consumption can be achieved.

An electronic device according to a ninth aspect of the invention includes a first burst control pulse generating circuit and a second burst control pulse generating circuit as a burst control pulse generating circuit containing: a timing generating circuit containing a ring oscillation circuit which oscillates a periodic signal based on a burst signal for controlling an ON and OFF condition of communication to output a plurality of timing signals based on the periodic signal; and a pulse generating logic circuit which generates a pulse signal used to provide communication based on the plural timing signals. The burst control pulse generating circuit generates the pulse signal one or more times when the burst signal is in the ON condition, and stops generation of the pulse signal when the burst signal is in the OFF condition. The oscillation period of the periodic signal oscillated from the ring oscillation circuit is longer than the pulse width of the pulse signal. The electronic device further includes: a parallel/serial converting circuit; a switching circuit which outputs the pulse signal generated from the first burst control pulse generating circuit when a serial signal outputted from the parallel/serial converting circuit is a first voltage, and outputs the pulse signal generated from the second burst control pulse generating circuit when the serial signal is a second voltage different from the first voltage; a transmitting device containing a digital modulating circuit which applies FSK (frequency shift keying) modulation to an inputted parallel signal and outputs the modulated parallel signal; and a receiving device containing the first burst control pulse generating circuit and the second burst control pulse generating circuit as the burst control pulse generating circuit.

According to this structure, the electronic device applies FSK modulation to an inputted parallel signal and outputs the modulated parallel signal when the burst signal is in the ON condition, and stops the output when the burst signal is in the OFF condition. Thus, substantial reduction of the effect of ON-OFF switching delay and decrease in power consumption can be achieved.

BRIEF DESCRIPTION OF THE DRAWINGS

The invention will be described with reference to the accompanying drawings, wherein like numbers refer to like elements.

FIGS. 1A through 1C are timing charts for explaining ON-OFF switching delay produced in systems according to related art of this invention.

DESCRIPTION OF EXEMPLARY EMBODIMENTS

Burst control pulse generating circuits according to several embodiments are hereinafter described with reference to the drawings.

First Embodiment

Structure of Burst Control Pulse Generating Circuit

Figure 2:
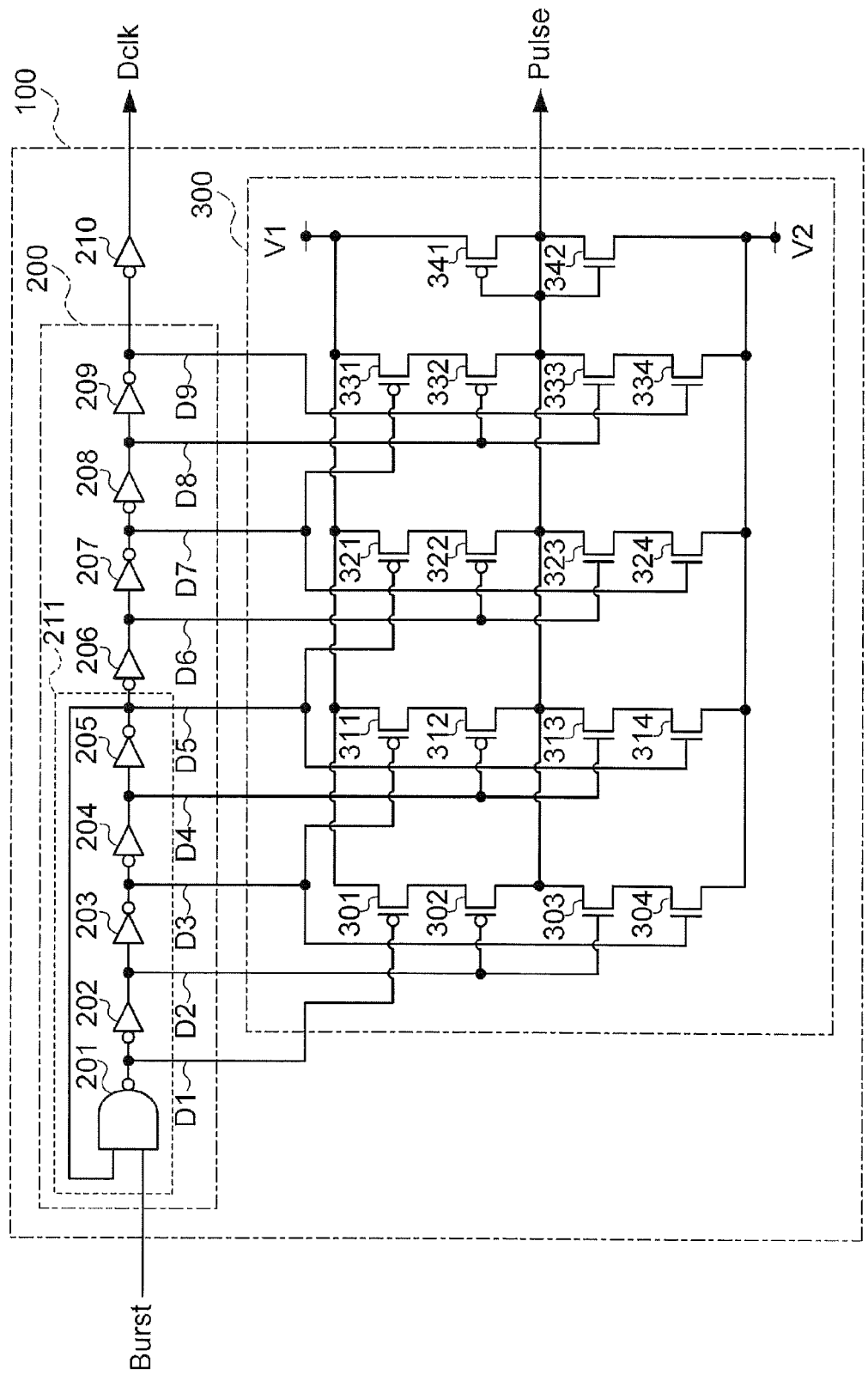
FIG. 2 is a circuit diagram showing a structure of a burst control pulse generating circuit according to a first embodiment.
Figure 3:
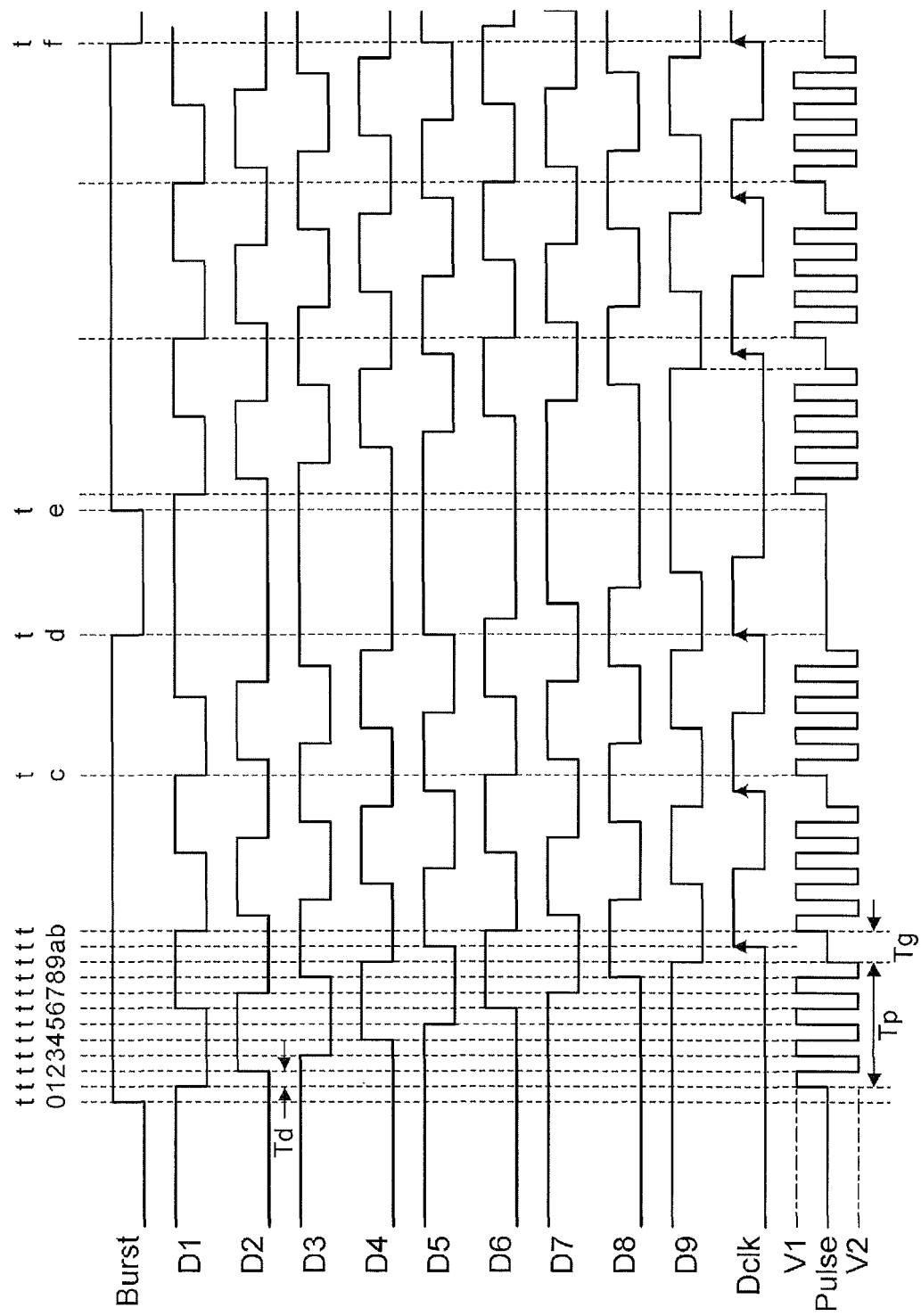
FIG. 3 is a timing chart showing an operation of the burst control pulse generating circuit according to the first embodiment.

Initially, a structure of a burst control pulse generating circuit according to a first embodiment is discussed with reference to FIGS. 2 and 3. FIG. 2 is a circuit diagram showing the structure of the burst control pulse generating circuit in the first embodiment. FIG. 3 is a timing chart showing the operation of the burst control pulse generating circuit in the first embodiment.

As illustrated in FIG. 2, a burst control pulse generating circuit 100 includes a timing generating circuit 200 and a pulse generating logic circuit 300. It is assumed that the numbers of n and m are both four in the first embodiment, but these numbers are not limited to four.

The timing generating circuit 200 has a two-input NAND 201 as a two-input logic circuit, and inverters 202 through 209 as NOT circuits. The four inverters 202 through 205 (n=4) are connected in series with the output pin of the two-input NAND 201. The output pin of the fourth inverter 205 is connected with one input pin of the two-input NAND 201, and a burst signal (Burst) is inputted to the other input pin of the two-input NAND 201. The two-input NAND 201 and the inverters 202 through 205 included in the timing generating circuit 200 constitute a ring generating circuit 211.

Four inverters 206 through 209 (m=4) are connected in series with the output pin of the fourth inverter 205. An inverter 210 is connected with the output pin of the inverter 209, and a clock signal (Dclk) is outputted from the output pin of the inverter 210.

It is assumed herein that an output signal from the two-input NAND 201 is D1, and that output signals from the inverters 202 through 209 are D2 through D9, respectively.

In the pulse generating logic circuit 300, Pch transistors 301 and 302 and Nch transistors 303 and 304 are connected in series between a high voltage V1 and a low voltage V2. The output signal D1 is inputted to the gate of the Pch transistor 301. The output signal D2 is inputted to each gate of the Pch transistor 302 and the Nch transistor 303. The output signal D3 is inputted to the gate of the Nch transistor 304. A pulse signal (Pulse) is outputted from the connecting point of the drains of the Pch transistor 302 and the Nch transistor 303.

In the pulse generating logic circuit 300, Pch transistors 311 and 312 and Nch transistors 313 and 314 are connected in series between the high voltage V1 and the low voltage V2. The output signal D3 is inputted to the gate of the Pch transistor 311. The output signal D4 is inputted to each gate of the Pch transistor 312 and the Nch transistor 313. The output signal D5 is inputted to the gate of the Nch transistor 314. The pulse signal Pulse is outputted from the connecting point of the drains of the Pch transistor 312 and the Nch transistor 313.

In the pulse generating logic circuit 300, Pch transistors 321 and 322 and Nch transistors 323 and 324 are connected in series between the high voltage V1 and the low voltage V2. The output signal D5 is inputted to the gate of the Pch transistor 321. The output signal D6 is inputted to each gate of the Pch transistor 322 and the Nch transistor 323. The output signal D7 is inputted to the gate of the Nch transistor 324. The pulse signal Pulse is outputted from the connecting point of the drains of the Pch transistor 322 and the Nch transistor 323.

In the pulse generating logic circuit 300, Pch transistors 331 and 332 and Nch transistors 333 and 334 are connected in series between the high voltage V1 and the low voltage V2. The output signal D7 is inputted to the gate of the Pch transistor 331. The output signal D8 is inputted to each gate of the Pch transistor 332 and the Nch transistor 333. The output signal D9 is inputted to the gate of the Nch transistor 334. The pulse signal Pulse is outputted from the connecting point of the drains of the Pch transistor 332 and the Nch transistor 333.

In the pulse generating logic circuit 300, a Pch transistor 341 and an Nch transistor 342 are connected in series between the high voltage V1 and the low voltage V2. The pulse signal Pulse is outputted from the connecting point of the gates of the Pch transistor 341 and the Nch transistor 342 and from the connecting point of the drains of the Pch transistor 341 and the Nch transistor 342.

Operation of Burst Control Pulse Generating Circuit

The operation of the burst control pulse generating circuit 100 is now discussed with reference to FIG. 3. It is assumed that each of the two-input NAND 201 and the inverters 202 through 210 has the same delay time Td. It is also assumed that the burst signal Burst is controlled by a not-shown control circuit.

While the burst signal Burst is kept at L level (OFF condition) until a time t0, the output signal D1 from the two-input NAND 201 remains at H level as can be seen from FIG. 3. Thus, the output signals D2, D4, D6, and D8 are kept at L level, and the output signals D3, D5, D7, and D9 are kept at H level. In the pulse generating logic circuit 300, the gates of the Pch transistors 301, 311, 321, 331 are H level and OFF condition, and the gates of the Nch transistors 303, 313, 323, and 333 are L level and OFF condition. Thus, the voltage of the pulse signal Pulse becomes an intermediate voltage between the voltages V1 and V2.

With the level shift of the burst signal Burst from L level to H level (ON condition) at the time to, the level of the output signal D1 from the two-input NAND 201 changes from H level to L level at a time t1 after elapse of the delay time Td. In the pulse generating logic circuit 300, both the gates of the Pch transistors 301 and 302 become L level and ON condition at the time t1. Thus, the voltage of the pulse signal Pulse becomes the voltage V1.

Then, the level of the output signal D2 shifts from L level to H level at a time t2 after elapse of the delay time Td from the time t1. In the pulse generating logic circuit 300, the gate of the Pch transistor 302 becomes H level and OFF condition and both the gates of the Nch transistors 303 and 304 become H level and ON condition at the time t2. Thus, the voltage of the pulse signal Pulse becomes the voltage V2.

Then, the level of the output signal D3 shifts from H level to L level at a time t3 after elapse of the delay time Td from the time t2. In the pulse generating logic circuit 300, both the gates of the Pch transistors 311 and 312 become L level and ON condition at the time t3. Thus, the voltage of the pulse signal Pulse becomes the voltage V1.

Then, the level of the output signal D4 shifts from L level to H level at a time t4 after elapse of the delay time Td from the time t3. In the pulse generating logic circuit 300, the gate of the Pch transistor 312 becomes H level and OFF condition and both the gates of the Nch transistors 313 and 314 become H level and ON condition at the time t4. Thus, the voltage of the pulse signal Pulse becomes the voltage V2.

Then, the level of the output signal D5 shifts from H level to L level at a time t5 after elapse of the delay time Td from the time t4. In the pulse generating logic circuit 300, both the gates of the Pch transistors 321 and 322 become L level and ON condition at the time t5. Thus, the voltage of the pulse signal Pulse becomes the voltage V1.

Then, the level of the output signal D6 shifts from L level to H level at a time t6 after elapse of the delay time Td from the time t5. In the pulse generating logic circuit 300, the gate of the Pch transistor 322 becomes H level and OFF condition and both the gates of the Nch transistors 323 and 324 become H level and ON condition at the time t6. Thus, the voltage of the pulse signal Pulse becomes the voltage V2. Since the output signal D5 has changed to L level at the time t5, the output signal D1 from the two-input NAND 201 becomes H level at the time t6.

Then, the level of the output signal D7 shifts from H level to L level at a time t7 after elapse of the delay time Td from the time t6. In the pulse generating logic circuit 300, both the gates of the Pch transistors 331 and 332 become L level and ON condition at the time t7. Thus, the voltage of the pulse signal Pulse becomes the voltage V1. Since the output signal D1 has changed to H level at the time t6, the output signal D2 becomes L level at the time t7.

Then, the level of the output signal D8 shifts from L level to H level at a time t8 after elapse of the delay time Td from the time t7. In the pulse generating logic circuit 300, the gate of the Pch transistor 332 becomes H level and OFF condition and both the gates of the Nch transistors 333 and 334 become H level and ON condition at the time t8. Thus, the voltage of the pulse signal Pulse becomes the voltage V2. Since the output signal D2 has changed to L level at the time t7, the output signal D3 becomes H level at the time t8.

Then, the level of the output signal D9 shifts from H level to L level at a time t9 after elapse of the delay time Td from the time t8. In the pulse generating logic circuit 300, the gate of the Pch transistor 332 becomes H level and OFF condition and the gate of the Nch transistor 334 becomes L level and OFF condition at the time t9. Thus, the voltage of the pulse signal Pulse becomes an intermediate voltage between the voltage V1 and the voltage V2. Since the output signal D3 has changed to H level at the time t8, the output signal D4 becomes L level at the time t9.

Then, the level of the clock signal Dclk shifts from L level to H level at a time ta after elapse of the delay time Td from the time t9. Since the output signal D4 has changed to H level at the time t9, the output signal D5 becomes H level at the time ta.

Since the output signal D5 has changed to H level dat the time ta, the output signal D1 becomes L level at a subsequent time tb. Thereafter, the operations from the time t1 to the time tb are repeated while the burst signal Burst is kept at H level.

More specifically, as can be seen from FIG. 3, the burst control pulse generating circuit 100 repeatedly generates modulated pulses as the pulse signals Pulse (width Tp=Td×8) each having four pulses for the period from the time t1 to the time t9 while the burst signal Burst remains at H level with a pulse interval (width Tg=Td×2) having intermediate voltage for the period from the time t9 to the time tb provided between the pulse signals Pulse. While the burst signal Burst is L level, the pulse signal Pulse has an intermediate voltage between the voltage V1 and the voltage V2. In FIG. 3, the modulated pulse is generated three times while the burst signal Burst remains at H level (from time t0 to time td).

Thereafter, the operations from the time t0 to the time td discussed above are similarly repeated during the period from a time te to a time tf.

Structure of Digital Modulating Circuit

Figure 4A:
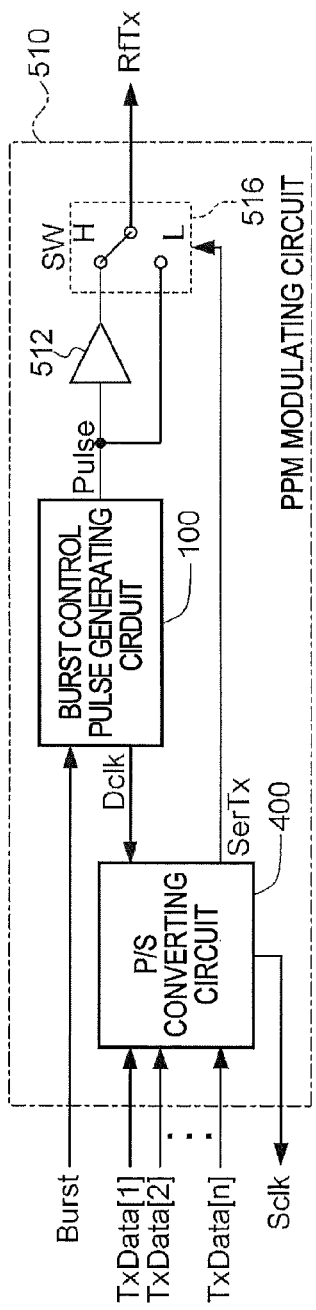
FIGS. 4A through 4C are circuit diagrams showing a structure of a digital modulating circuit using the burst control pulse generating circuit.
Figure 4B:
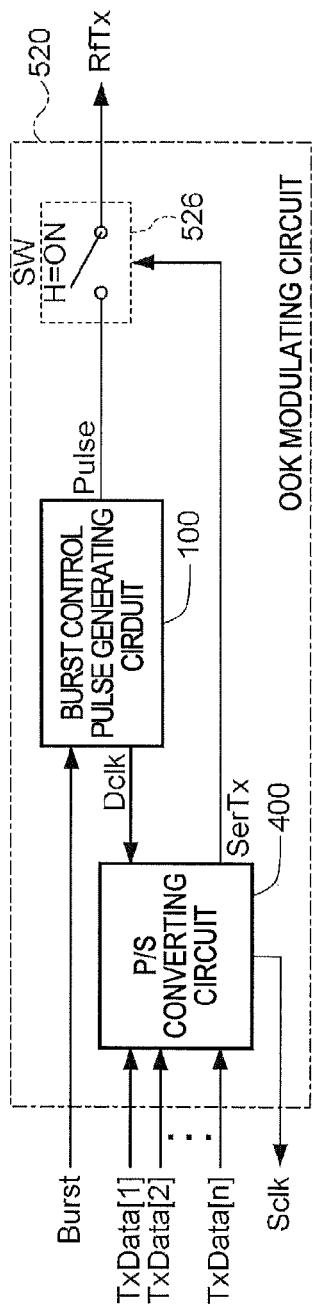
Figure 4C:
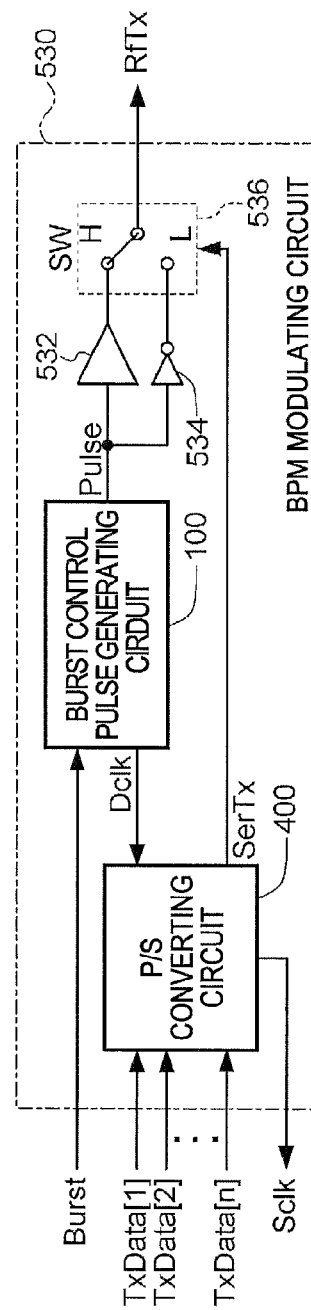
Figure 5A:
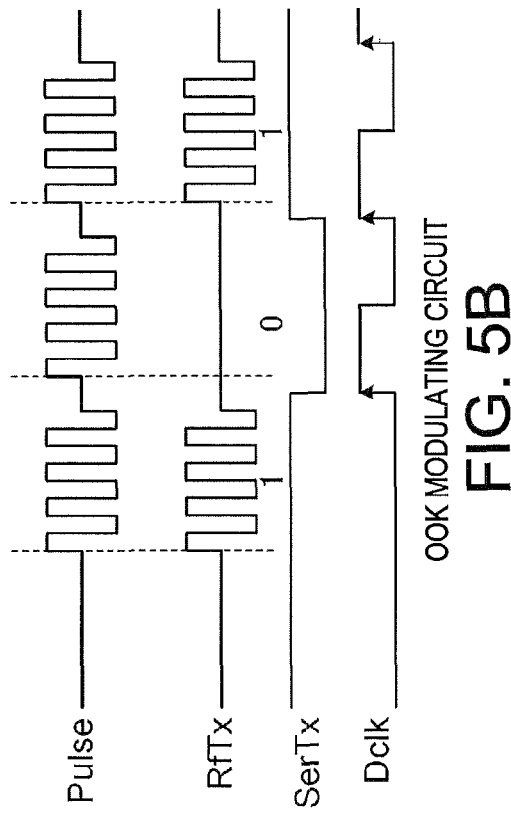
FIGS. 5A through 5C are timing charts showing an operation of the corresponding digital modulating circuit using the burst control pulse generating circuit shown in FIGS. 4A through 4C.
Figure 5B:
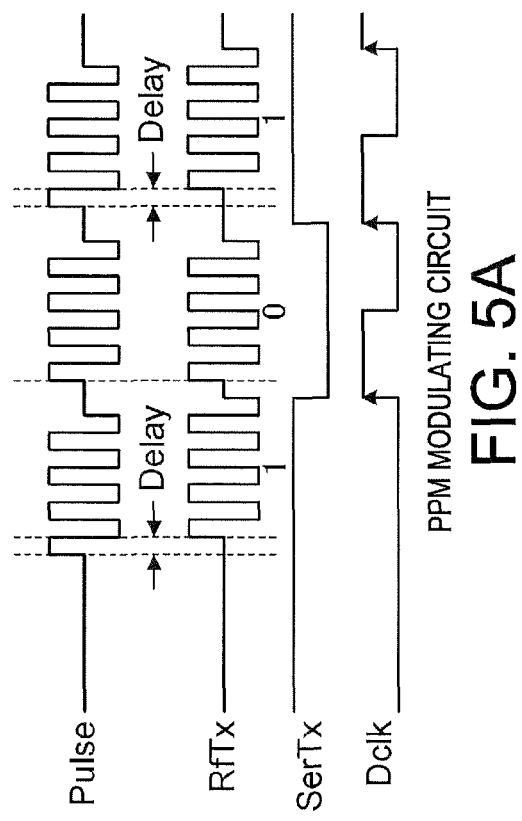
Figure 5C:
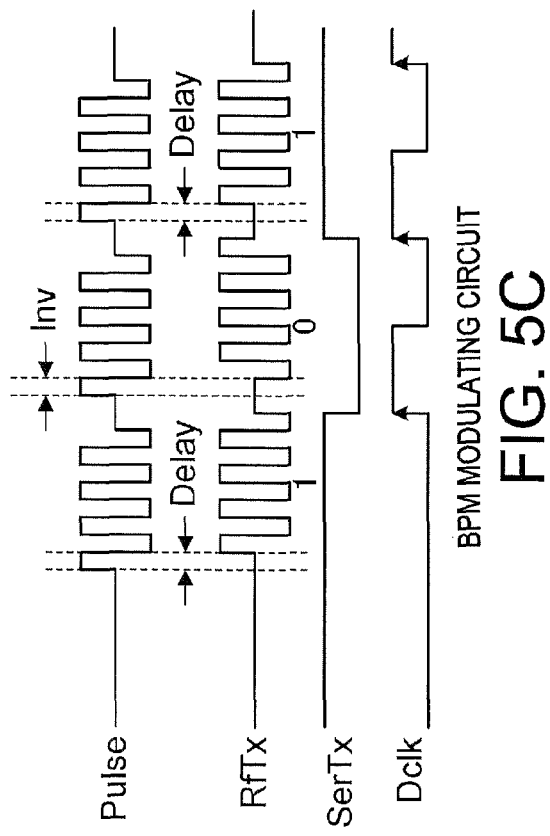

Structures of digital modulating circuits each of which uses the burst control pulse generating circuit are now explained with reference to FIGS. 4A through 4C and 5A through 5C. FIGS. 4A through 4C are circuit diagrams each of which shows a structure of a digital modulating circuit using the burst control pulse generating circuit. FIGS. 5A through 5C are timing charts each of which shows an operation of the corresponding digital modulating circuit using the burst control pulse generating circuit shown in FIGS. 4A through 4C.

FIG. 4A shows a PPM modulating circuit 510 which applies PPM (pulse position modulation) to an inputted parallel signal and outputs the modulated signal. The PPM modulating circuit 510 includes the burst control pulse generating circuit 100, a parallel/serial converting circuit 400, a delay circuit 512, and a switching circuit 516.

The burst control pulse generating circuit 100 receives the burst signal Burst from the not-shown control circuit and outputs the pulse signal Pulse and the clock signal Dclk. The parallel/serial converting circuit 400 receives parallel signals TxData "1" through "n" and the clock signal Dclk, and outputs a serial signal SerTx and a clock signal Sclk. The switching circuit 516 is controlled by the serial signal SerTx. When the serial signal SerTx is H level (first voltage), the switching circuit 516 outputs the pulse signal Pulse from an output pin RfTx via the delay circuit 512. When the serial signal SerTx is L level (second voltage), the switching circuit outputs the pulse signal Pulse from the output pin RfTx.

FIG. 5A is a timing chart showing the operation of the PPM modulating circuit 510. When the serial signal SerTx is H level, the PPM modulating circuit 510 outputs the pulse signal Pulse from the output pin RfTx after elapse of a delay time Delay of the delay circuit 512. When the serial signal SerTx is L level, the PPM modulating circuit 510 outputs the pulse signal Pulse from the output pin RfTx.

FIG. 4B shows an OOK modulating circuit 520 which applies OOK (on-off keying) modulation to an inputted parallel signal and outputs the modulated signal. The OOK modulating circuit 520 includes the burst control pulse generating circuit 100, the parallel/serial converting circuit 400, and a switching circuit 526.

The switching circuit 526 is controlled by the serial signal SerTx. When the serial signal SerTx is H level (first voltage), the switching circuit 526 outputs the pulse signal Pulse from the output pin RfTx. When the serial signal SerTx is L level (second voltage), the switching circuit 526 disconnects the pulse signal Pulse from the output pin RfTx.

FIG. 5B is a timing chart showing the operation of the OOK modulating circuit 520. When the serial signal SerTx is H level (first voltage), the OOK modulating circuit 520 outputs the pulse signal Pulse from the output pin Rf Tx. When the serial signal SerTx is L level (second voltage), the output from the output pin RfTx has high impedance.

FIG. 4C shows a BPM modulating circuit 530 which applies BPM (bi-phase modulation) to an inputted parallel signal and outputs the modulated signal. The BPM modulating circuit 530 includes the burst control pulse generating circuit 100, the parallel/serial converting circuit 400, a delay circuit 532, an inverter 534, and a switching circuit 536.

The switching circuit 536 is controlled by the serial signal SerTx. When the serial signal SerTx is H level, the switching circuit 536 outputs the pulse signal Pulse from the output pin RfTx via the delay circuit 532. When the serial signal SerTx is L level, the switching circuit 536 outputs the pulse signal Pulse from the output pin RfTx via the inverter 534.

FIG. 5C is a timing chart showing the operation of the BPM modulating circuit 530. When the serial signal SerTx is H level, the BPM modulating circuit 530 outputs the pulse signal Pulse from the output pin RfTx after elapse of the delay time Delay of the delay circuit 512. When the serial signal SerTx is L level, the BPM modulating circuit 530 reverses the pulse signal Pulse and outputs the reversed signal from the output pin RfTx after elapse of a delay time Inv of the inverter 534.

Structures of Transmitting and Receiving Circuits

Figure 12:
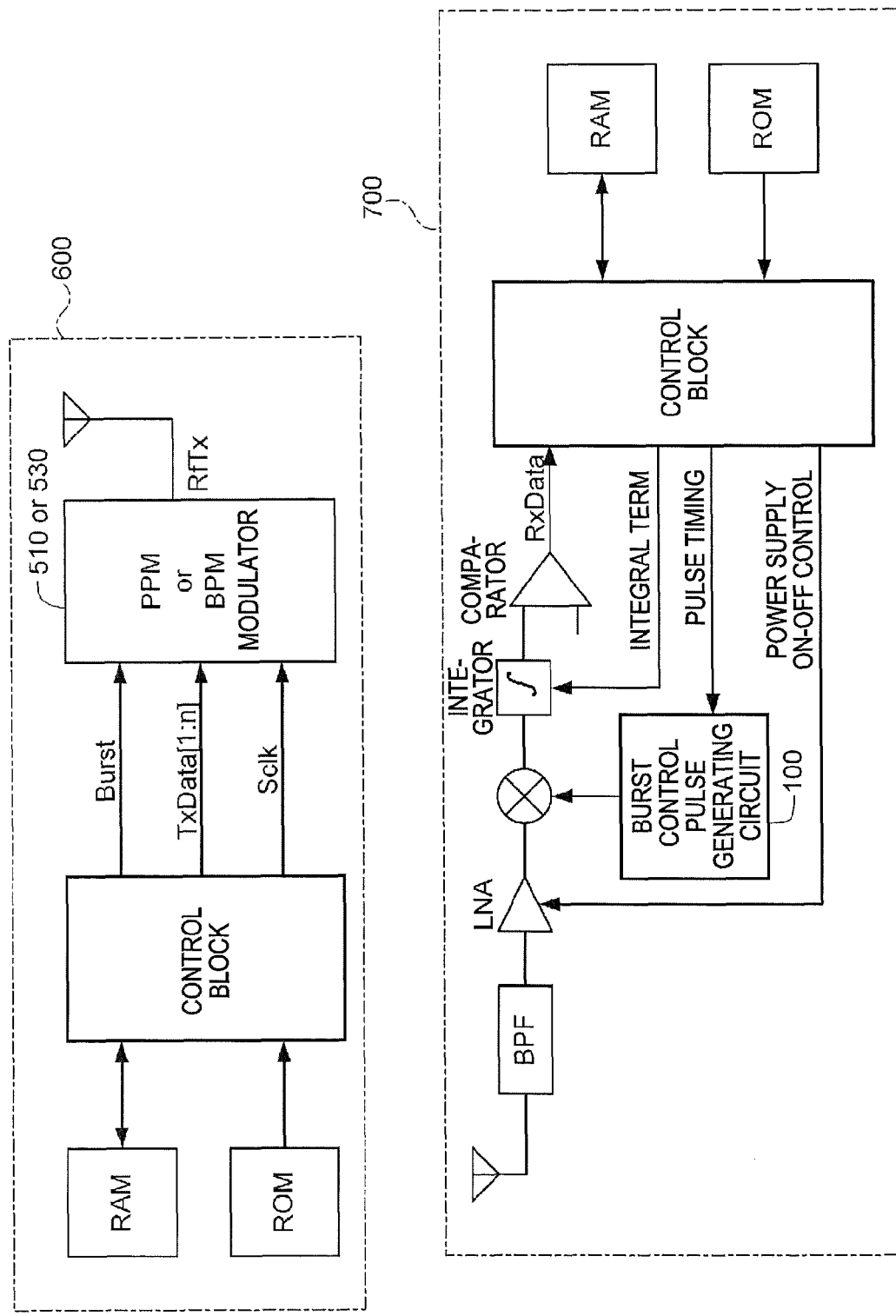
FIG. 12 is a circuit diagram showing structures of transmitting and receiving circuits using a PPM modulating circuit or a BPM modulating circuit.
Figure 13:
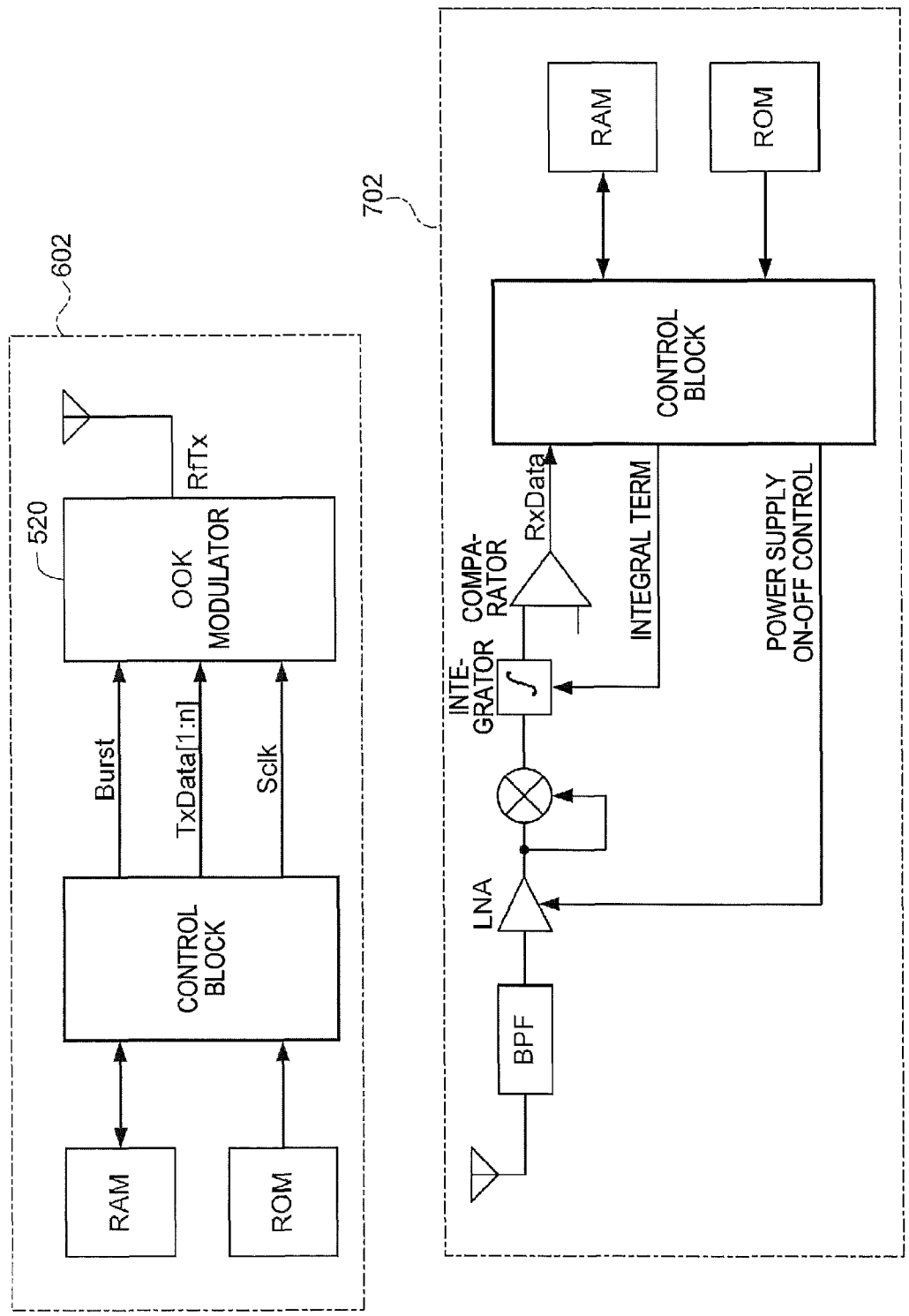
FIG. 13 is a circuit diagram showing structures of transmitting and receiving circuits using an OOK modulating circuit.

Structures of transmitting and receiving circuits using the digital modulating circuit are now explained with reference to FIGS. 12 and 13. FIG. 12 is a circuit diagram showing structures of transmitting and receiving circuits using the PPM modulating circuit or the BPM modulating circuit. FIG. 13 is a circuit diagram showing structures of transmitting and receiving circuits using the OOK modulating circuit.

As shown in FIG. 12, a transmitting circuit 600 uses the PPM modulating circuit 510 or the BPM modulating circuit 530, and a receiving circuit 700 uses the burst control pulse generating circuit 100. When a difference corresponding to half period of the modulating frequency of the same pulse (Delay) is produced between "1" and "0" in the PPM as shown in FIG. 5A, the PPM and the BPM can be detected by the same receiving circuit structure.

As shown in FIG. 13, a transmitting circuit 602 uses the OOK modulating circuit 520. However, a receiving circuit 702 does not use the burst control pulse generating circuit 100. In the case of the structure using the OOK modulating circuit 520, power can be detected by squared detection.

According to this embodiment, the following advantages can be offered.

According to this embodiment, the pulse signal is generated one or more times when the burst signal Burst is in the ON condition, and generation of the pulse signal is stopped when the burst signal is in the OFF condition. Therefore, substantial reduction of the effect of ON-OFF switching delay and decrease in power consumption can be achieved. The number of waves in one generated pulse signal Pulse increases as the numbers of n and m increase. In this case, the bit rate lowers due to narrowed bandwidth, but the pulse signal Pulse has greater resistance to interference.

Second Embodiment

A burst control pulse generating circuit according to a second embodiment is now described. In the burst control pulse generating circuit 100 according to the first embodiment, there is a possibility of interference between codes when the time interval between pulses is short due to delayed convergence of received pulses caused by the effect of transmission paths such as multi paths, the effect of group delay characteristics of a filter or antenna, or for other reasons. In the second embodiment, a burst control pulse generating circuit 110 adapted to control the pulse interval Tg according to the receiving condition is proposed. In the second embodiment, it is assumed that the numbers of n and m are four, but these numbers are not limited to four.

Figure 6:
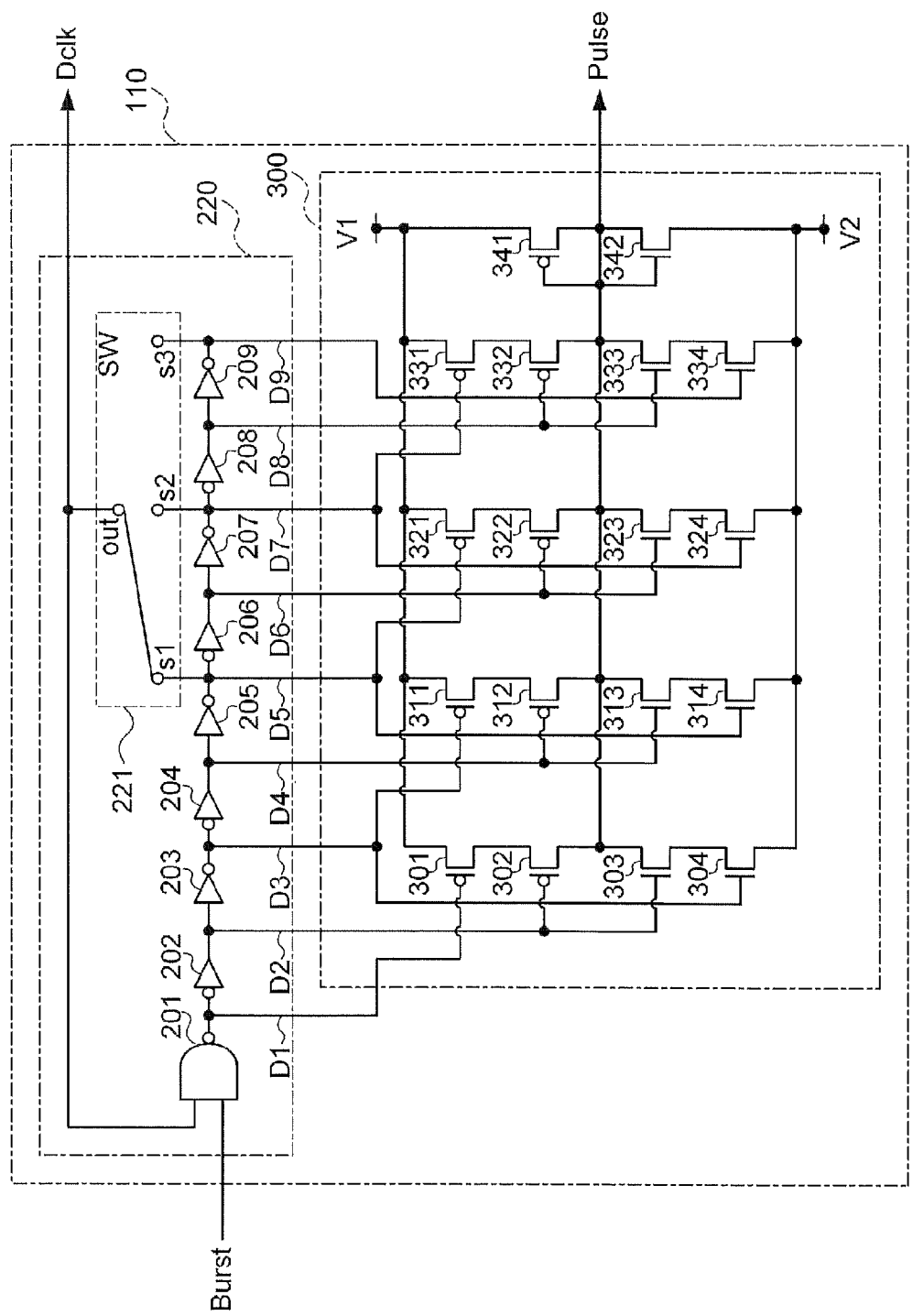
FIG. 6 is a circuit diagram showing a structure of a burst control pulse generating circuit according to a second embodiment.
Figure 7A:
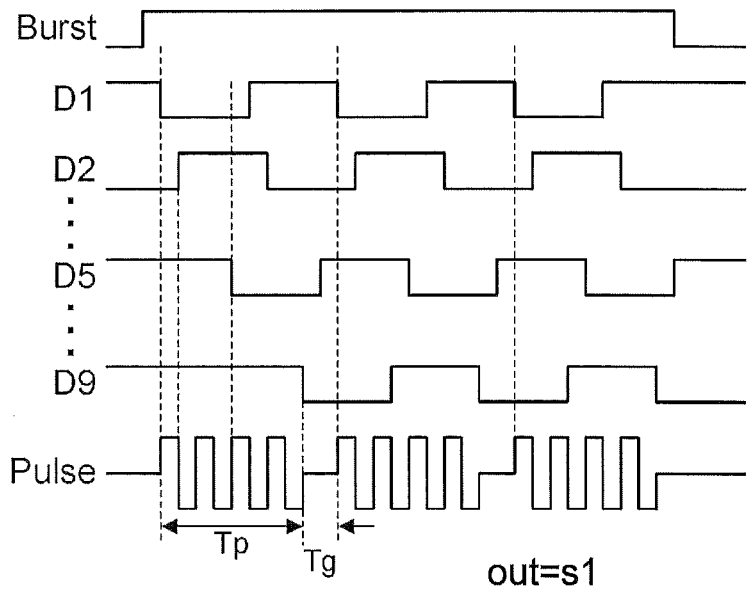
FIGS. 7A and 7B are timing charts showing an operation of the burst control pulse generating circuit according to the second embodiment.
Figure 7B:
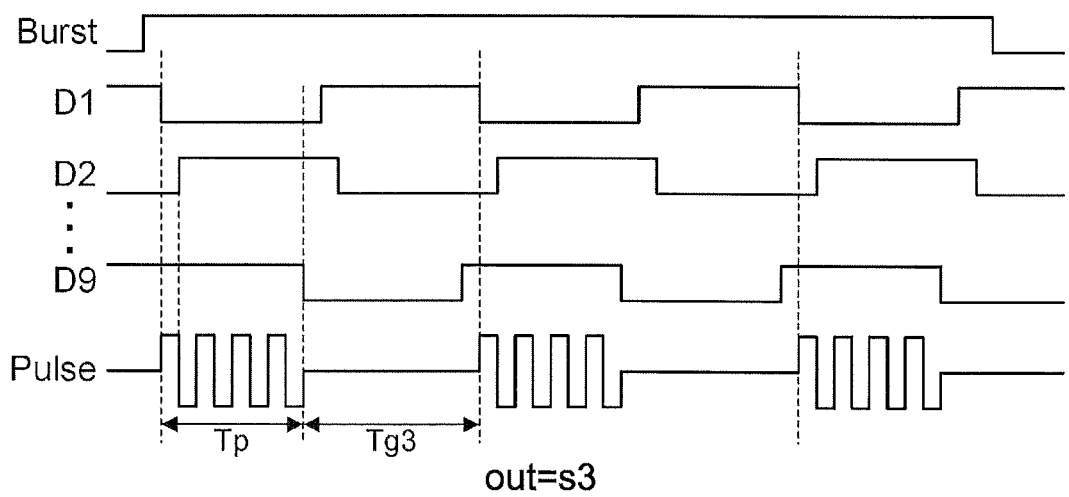

The structure of the burst control pulse generating circuit according to the second embodiment is now discussed with reference to FIGS. 6 and 7A and 7B. FIG. 6 is a circuit diagram showing the structure of the burst control pulse generating circuit according to the second embodiment. FIGS. 7A and 7B are timing charts showing the operation of the burst control pulse generating circuit according to the second embodiment.

As illustrated in FIG. 6, the burst control pulse generating circuit 110 includes a timing generating circuit 220 capable of switching ring oscillation period, and a pulse generating logic circuit 300.

The timing generating circuit 220 has the two-input NAND 201 as a two-input logic circuit, the inverters 202 through 209 as NOT circuits, and a switching circuit 221. The four inverters 202 through 205 (n=4) are connected in series with the output pin of the two-input NAND 201. The four inverters 206 through 209 (m=4) are connected in series with the output pin of the fourth inverter 205.

The switching circuit 221 has an output pin out and input pins s1, s2 and s3. The switching circuit 221 is so constructed as to switch between connection of the output pin out with the input pin s1, connection of the output pin out with the input pin s2, and connection of the output pin out with the input pin s3. The output pin out is connected with one input pin of the two-input NAND 201, and the clock signal Dclk is outputted from the output pin out to the outside.

The input pin s1 is connected with the output pin of the inverter 205. The input pin s2 is connected with the output pin of the inverter 207. The input pin s3 is connected with the output pin of the inverter 209. When the output pin out of the switching circuit 221 is connected with the input pin s1, ring oscillation is produced by the two-input NAND 201 and the four inverters 202 through 205. When the output pin out of the switching circuit 221 is connected with the input pin s2, ring oscillation is produced by the two-input NAND 201 and the six inverters 202 through 207. When the output pin out of the switching circuit 221 is connected with the input pin s3, ring oscillation is produced by the two-input NAND 201 and the eight inverters 202 through 209.

FIG. 7A is a timing chart showing the operation of the timing generating circuit 220 when the output pin out of the switching circuit 221 is connected with the input pin s1. FIG. 7B is a timing chart showing the operation of the timing generating circuit 220 when the output pin out of the switching circuit 221 is connected with the input pin s3.

When the output pin out of the switching circuit 221 is connected with the input pin s1 as shown in FIG. 7A, the modulating pulse width Tp is expressed as Tp=Td×8 and the pulse interval Tg as Tg=Td×2 as shown in FIG. 7A. When the output pin out of the switching circuit 221 is connected with the input pin s3, the modulating pulse width Tp is expressed as Tp=Td×8 and a pulse interval Tg3 as Tg3=Td×10 as shown in FIG. 7B.

According to the burst control pulse generating circuit 110 in the second embodiment discussed above, the pulse interval is varied by the switching circuit 221 with the modulating pulse width kept constant. In this case, the power ON time can be decreased to the minimum with reduced effect of the interference between codes. As a result, lower power consumption is needed than in the case where a large fixed pulse interval is established in advance considering the effect of interference between codes.

Third Embodiment

A burst control pulse generating circuit according to a third embodiment is now described. In the third embodiment, a burst control pulse generating circuit 120 capable of maintaining a constant bit transmitting speed while varying a modulating pulse width is proposed. In this embodiment, it is assumed that the numbers of n and m are both four, but these numbers are not limited to four.

Figure 8:
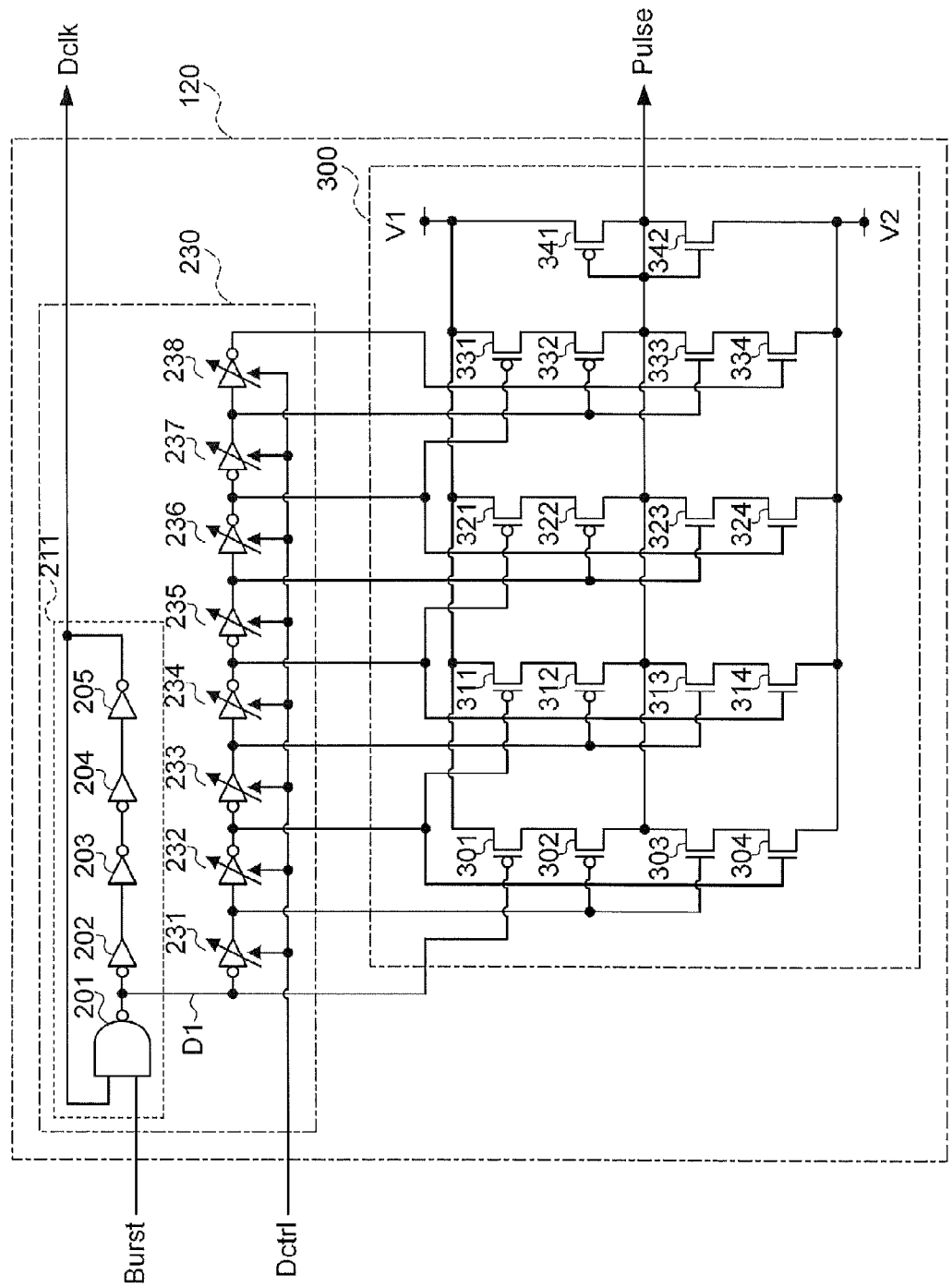
FIG. 8 is a circuit diagram showing a structure of a burst control pulse generating circuit according to a third embodiment.
Figure 9:
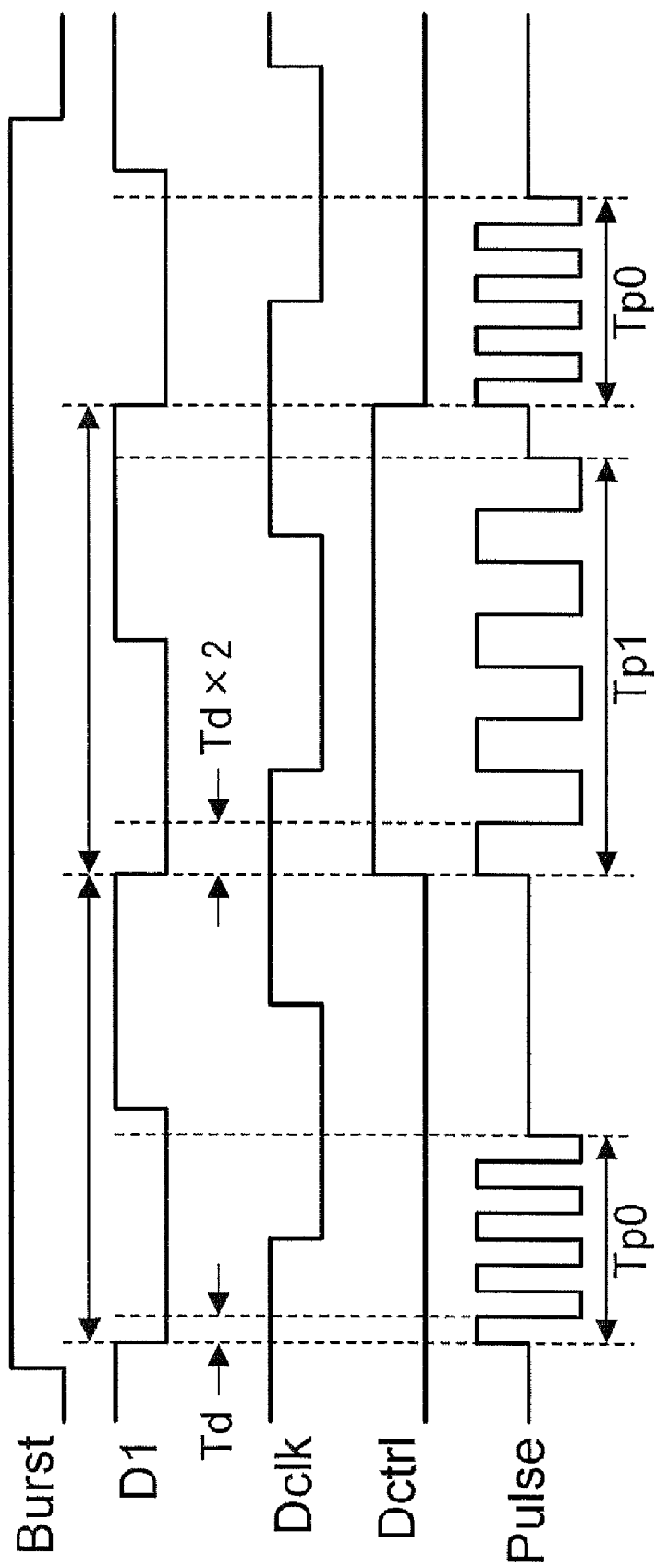
FIG. 9 is a timing chart showing an operation of the burst control pulse generating circuit according to the third embodiment.

The structure of the burst control pulse generating circuit according to the third embodiment is now discussed with reference to FIGS. 8 and 9. FIG. 8 is a circuit diagram showing the structure of the burst control pulse generating circuit according to the third embodiment. FIG. 9 is a timing chart showing the operation of the burst control pulse generating circuit according to the third embodiment.

As shown in FIG. 8, the burst control pulse generating circuit 120 includes a timing generating circuit 1230 which maintains a constant bit transmitting speed while varying a modulating pulse width, and the pulse generating logic circuit 300.

The timing generating circuit 230 has the two-input NAND 201 as a two-input logic circuit, the inverters 202 through 205 as NOT circuits, and delay control inverters 231 through 238 as delay control NOT circuits adapted to control delay time by a delay control signal Dctrl. The four inverters 202 through 205 (n=4) are connected in series with the output pin of the two-input NAND 201. The output pin of the fourth inverter 205 is connected with one input pin of the two-input NAND 201. The burst signal Burst is inputted to the other input pin of the two-input NAND 201. The clock signal Dclk is outputted from the output pin of the inverter 205.

The delay control inverters 231 through 238 are connected in series with the output pin of the two-input NAND 201 and each delay time of the delay control inverters 231 through 238 is controlled according to the delay control signal Dctrl. As can be seen from the timing chart in FIG. 9, it is assumed that each delay time of the delay control inverters 231 through 238 is Td when the delay control signal Dctrl is L level, and that each delay time of the delay control inverters 231 through 238 is Td×2 when the delay control signal Dctrl is H level.

The timing generating circuit 230 can successively vary the modulating pulse width (modulating frequency) by switching the delay control signal Dctrl while the burst signal Burst is in the ON condition. That is, the timing generating circuit 230 can perform FSK (frequency shift keying) modulation which varies the pulse modulating frequency.

Structure of FSK Modulating Circuit

Figure 14:
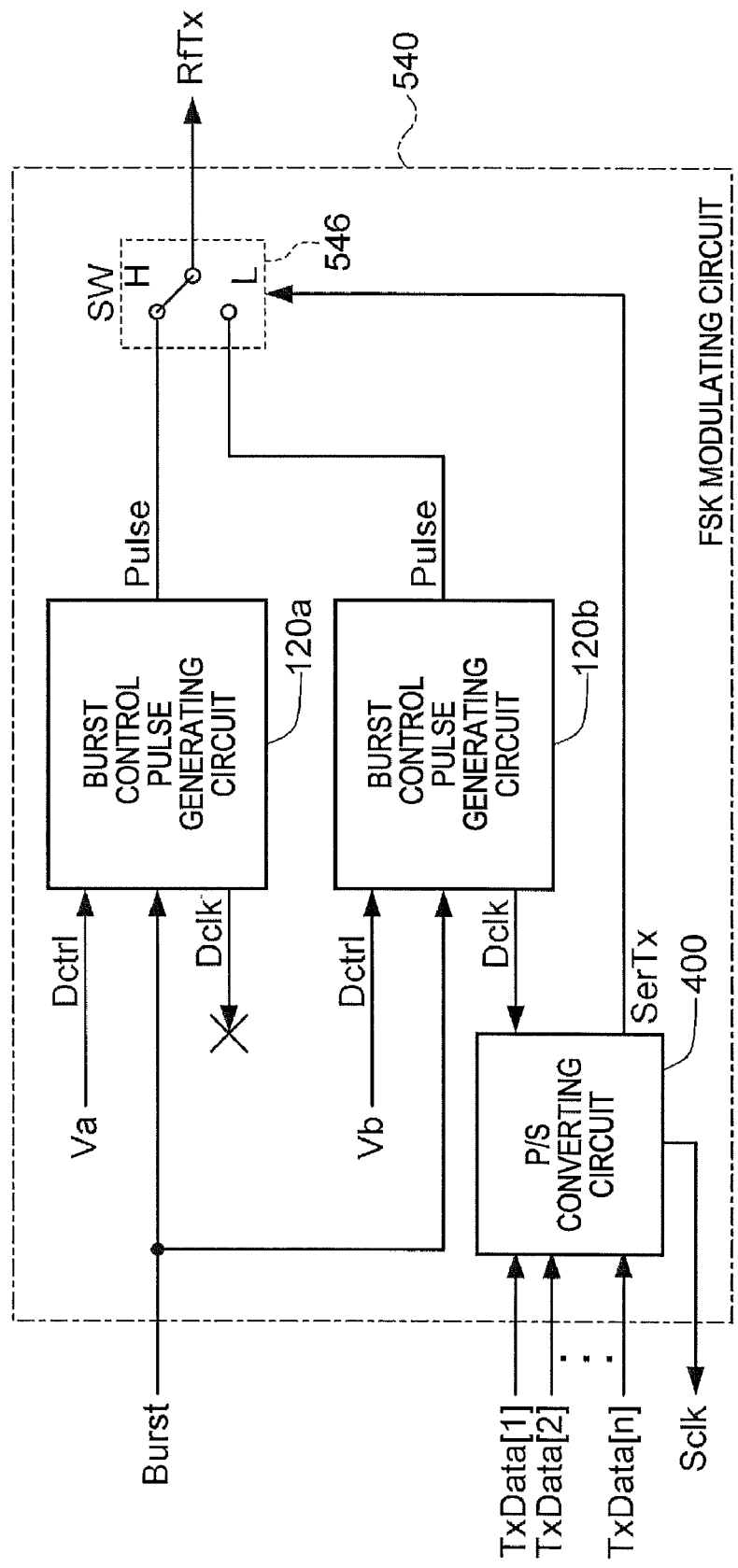
FIG. 14 is a circuit diagram showing a structure of an FSK modulating circuit using burst control pulse generating circuits.

A structure of an FSK modulating circuit which uses the burst control pulse generating circuit is now discussed with reference to FIG. 14. FIG. 14 is a circuit diagram showing the structure of the FSK modulating circuit using the burst control pulse generating circuit.

As shown in FIG. 14, an FSK modulating circuit 540 has two burst control pulse generating circuits 120a and 120b, the parallel/serial converting circuit 400, and a switching circuit 546.

The two burst control pulse generating circuits 120a and 120b are controlled by delay control signals Va and Vb, respectively, which are different delay control signals Dctrl. The switching circuit 546 is controlled by the serial signal SerTx. When the serial signal SerTx is H level (first voltage), the switching circuit 546 outputs the pulse signal Pulse of the burst control pulse generating circuit 120*a* from the output pin RfTx. When the serial signal SerTx is L level (second voltage), the switching circuit 546 outputs the pulse signal Pulse of the burst control pulse generating circuit 120*b* from the output pin RfTx.

FIG. 9 shows an example where the pulse modulating frequency is controlled for each bit. However, when the response speed of delay control is not sufficient, the burst control pulse generating circuits 120*a* and 120*b* controlled by the Va and Vb, respectively, as the delay control signals Dctrl are prepared in advance so that the switching circuit 546 switches between these circuits 120*a* and 120*b* according to the bit data. While the two burst control pulse generating circuits 120*a* and 120*b* are used in this example, a combination of larger number of burst control pulse generating circuits 120 may be employed.

Structure of Transmitting and Receiving Circuits Using FSK Modulating Circuit

Figure 15:
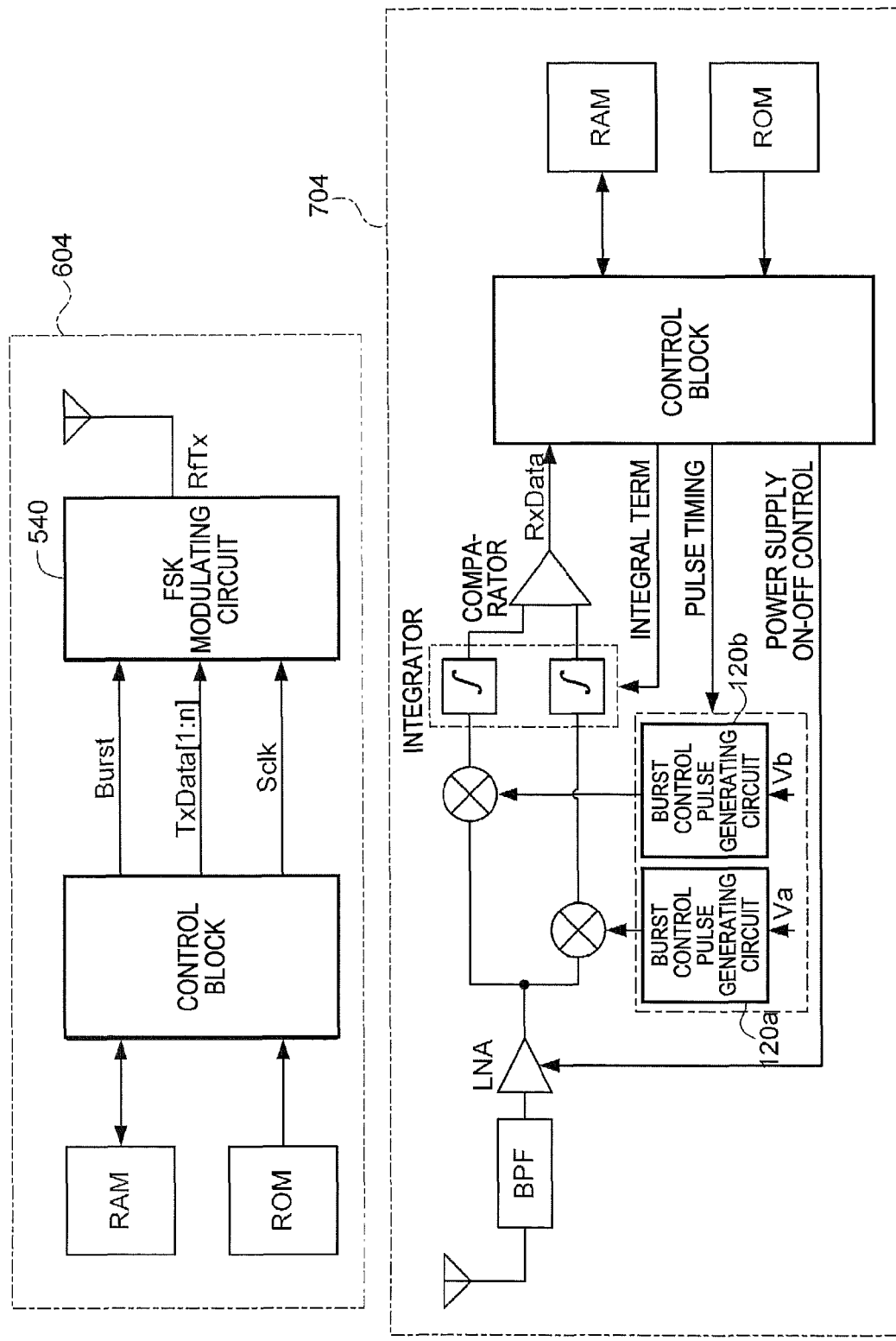
FIG. 15 is a circuit diagram showing structures of transmitting and receiving circuits using the FSK modulating circuit.

A structure example of transmitting and receiving circuits using the FSK modulating circuit is now explained with reference to FIG. 15. FIG. 15 is a circuit diagram showing the structures of the transmitting and receiving circuits using the FSK modulating circuit.

As shown in FIG. 15, the FSK modulating circuit 540 is contained in a transmitting circuit 604. The two burst control pulse generating circuits 120*a* and 120*b* controlled by the Va and Vb, respectively, as the delay control signals Dctrl are prepared in advance as reference signal sources for a receiving circuit 704. In this structure, correlations with received signals are calculated to make bit judgment.

According to the burst control pulse generating circuit 120 in the third embodiment described above which maintains a constant ring oscillation period, signals can be received on the receiving side at constant bit intervals regardless of the level of the pulse modulating frequency. Thus, simplification of the circuit structure is enhanced. Moreover, increase in the number of communications capable of achieving simultaneous communication and higher communication speed can be achieved by providing frequency division multiplex communication capable of varying frequency for the purpose of reducing interference from other systems or to other systems.

Fourth Embodiment

A burst control pulse generating circuit according to a fourth embodiment is now described. In the fourth embodiment, a burst control pulse generating circuit 130 capable of varying a modulating pulse width while maintaining a constant pulse interval is proposed.

Figure 10:
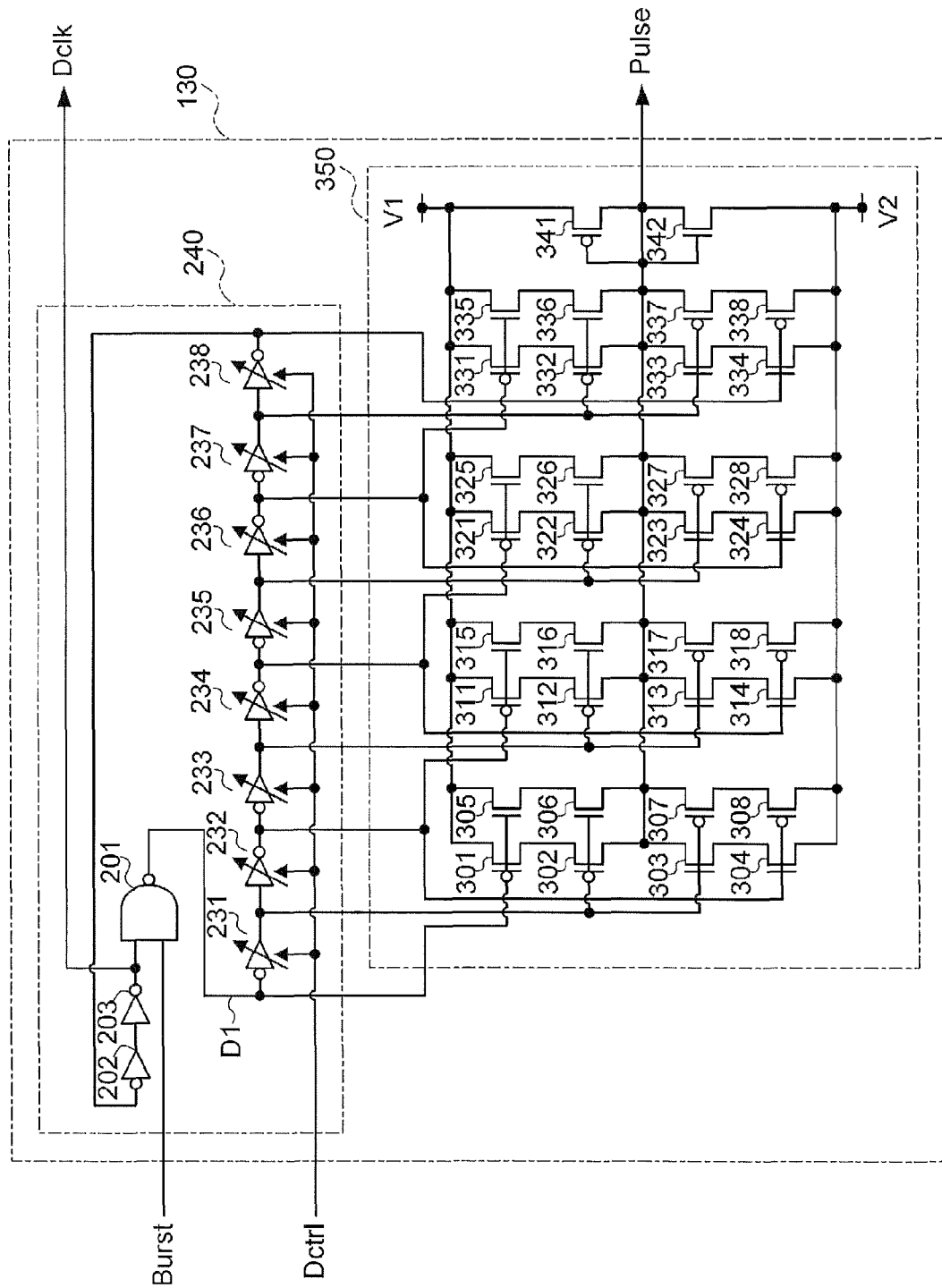
FIG. 10 is a circuit diagram showing a structure of a burst control pulse generating circuit according to a fourth embodiment.
Figure 11:
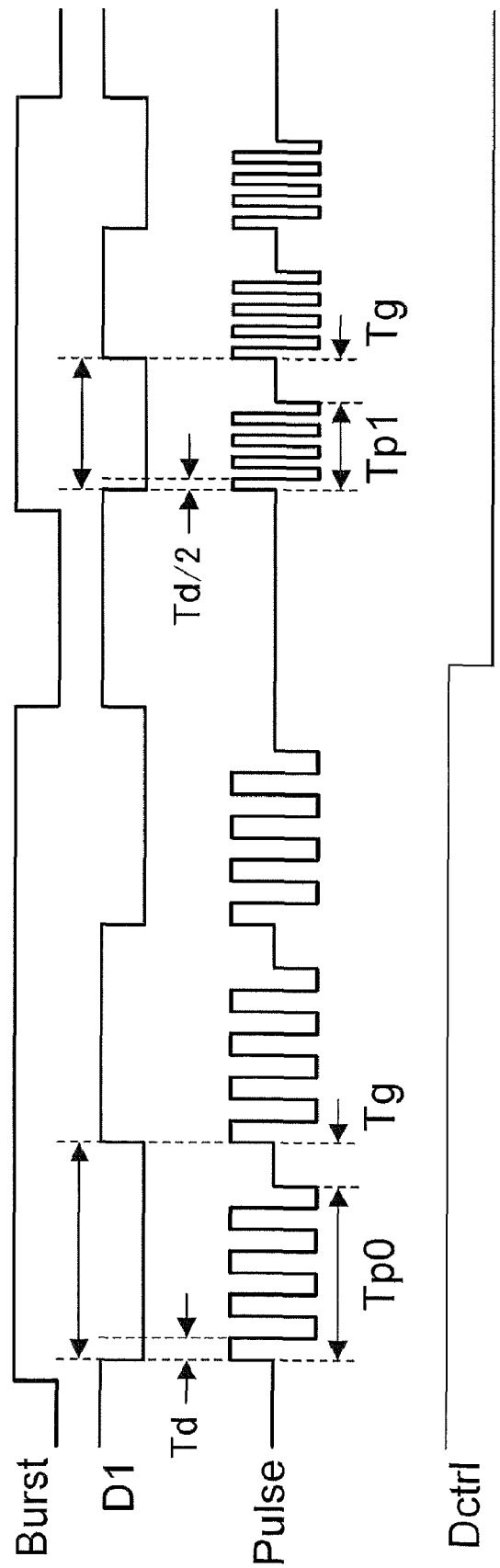
FIG. 11 is a timing chart showing an operation of the burst control pulse generating circuit according to the fourth embodiment.

The structure of the burst control pulse generating circuit according to the fourth embodiment is now discussed with reference to FIGS. 10 and 11. FIG. 10 is a circuit diagram showing the structure of the burst control pulse generating circuit in the fourth embodiment. FIG. 11 is a timing chart showing the operation of the burst control pulse generating circuit in the fourth embodiment.

As shown in FIG. 10, the burst control pulse generating circuit 130 includes a timing generating circuit 240 which varies a modulating pulse width while maintaining a constant pulse interval, and a pulse generating logic circuit 350.

The timing generating circuit 240 has the two-input NAND 201 as a two-input logic circuit, the inverters 202 and 203, and the delay control inverters 231 through 238 as delay control NOT circuits adapted to control delay time by the delay control signal Dctrl. The delay control inverters 231 through 238 are connected in series with the output pin of the two-input NAND 201, and each delay time of the delay control inverters 231 through 238 is controlled according to the delay control signal Dctrl. The output pin of the delay control inverter 238 is connected with one input pin of the two-input NAND 201 via the two inverters 202 and 203. The burst signal Burst is inputted to the other input pin of the two-input NAND 201. The clock signal Dclk is outputted from the output pin of the inverter 203.

As shown in the timing chart in FIG. 11, it is assumed that each delay time of the delay control inverters 231 through 238 is Td when the delay control signal Dctrl is H level, and that each delay time of the delay control inverters 231 through 238 is Td÷2 when the delay control signal Dctrl is L level.

The timing generating circuit 240 successively varies the modulating pulse width (modulating frequency) by switching the delay control signal Dctrl during the period of ON condition of the burst signal Burst. Simultaneously, the timing generating circuit 240 keeps the pulse interval Tg constant.

As described above, the burst control pulse generating circuit 130 in the fourth embodiment varies the modulating pulse width while keeping the pulse interval Tg constant. Thus, the effect of interference between codes can be reduced regardless of the level of the pulse modulating frequency under the condition where the problem of the interference between codes is present.

While the burst control pulse generating circuits according to the specific embodiments have been described, it is intended that the invention should not be limited to these examples. It is therefore understood that various modifications and changes may be made without departing from the scope and spirit of the invention.

Modified Example 1

Figure 16:
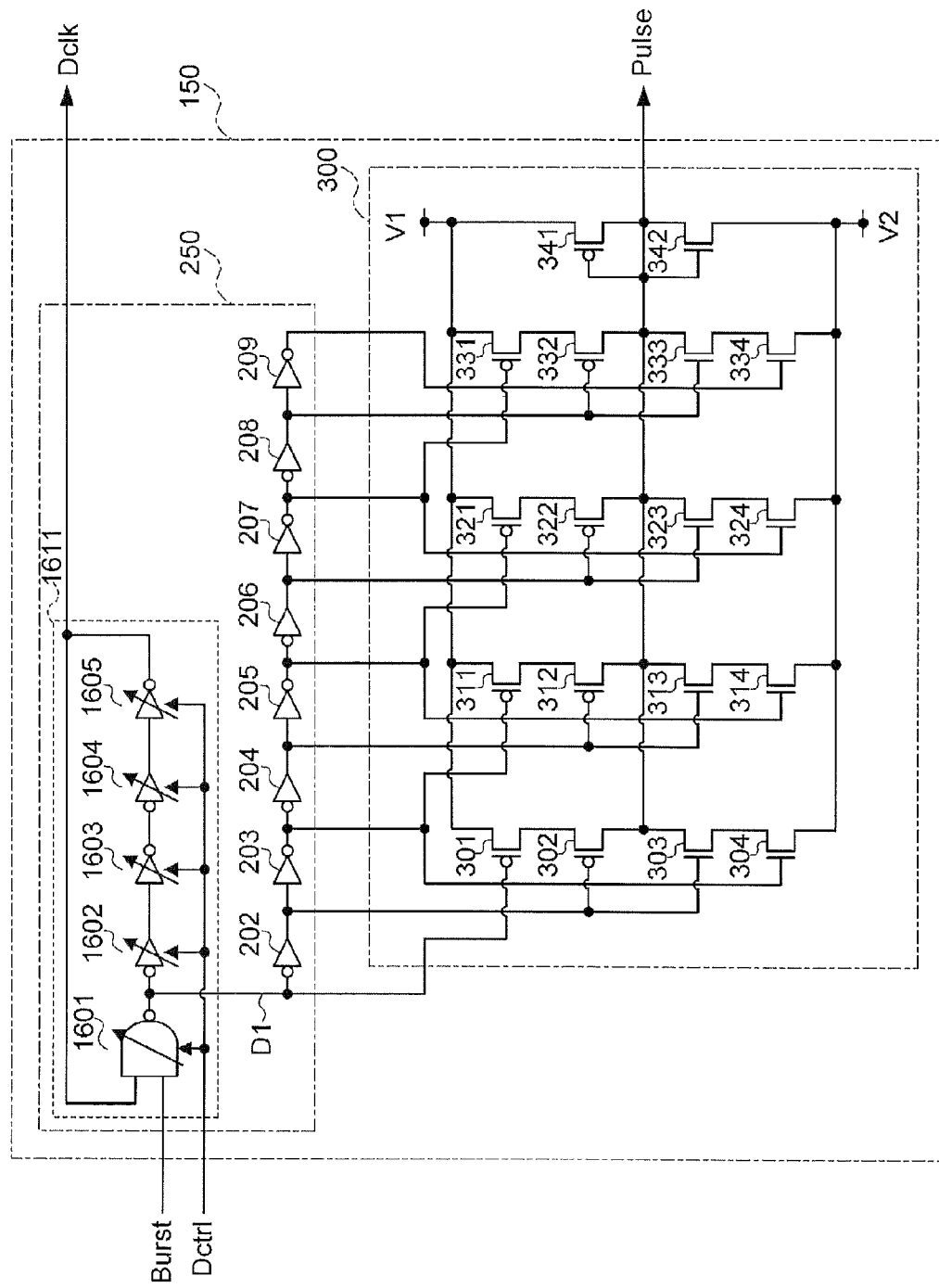
FIG. 16 is a circuit diagram showing a structure of a burst control pulse generating circuit in a modified example 1.

A burst control pulse generating circuit according to a modified example 1 is now discussed. FIG. 16 is a circuit diagram showing the structure of the burst control pulse generating circuit according to the modified example 1. While the timing generating circuit 230 shown in FIG. 8 is used in the third embodiment, a timing generating circuit 250 shown in FIG. 16 may be used in this structure instead of the timing generating circuit 230. The timing generating circuit 250 has a delay control two-input NAND 1601 shown in FIG. 16 in lieu of the two-input NAND 201 shown in FIG. 8, and delay control inverters 1602 through 1605 shown in FIG. 16 in lieu of the inverters 202 through 205 shown in FIG. 8. On the contrary, the timing generating circuit 250 shown in FIG. 16 has the inverters 202 through 209 in lieu of the delay control inverters 231 through 238 shown in FIG. 8. It is possible to provide delay control logic circuits for all the circuits included in the timing generating circuit 250 by replacing the inverters 202 through 209 with the delay control inverters 231 through 238. According to the modified example 1, the pulse generating interval can be varied with the pulse modulating frequency kept constant. Thus, the effect of interference between codes can be reduced depending on circumstances.

Modified Example 2

Figure 17:
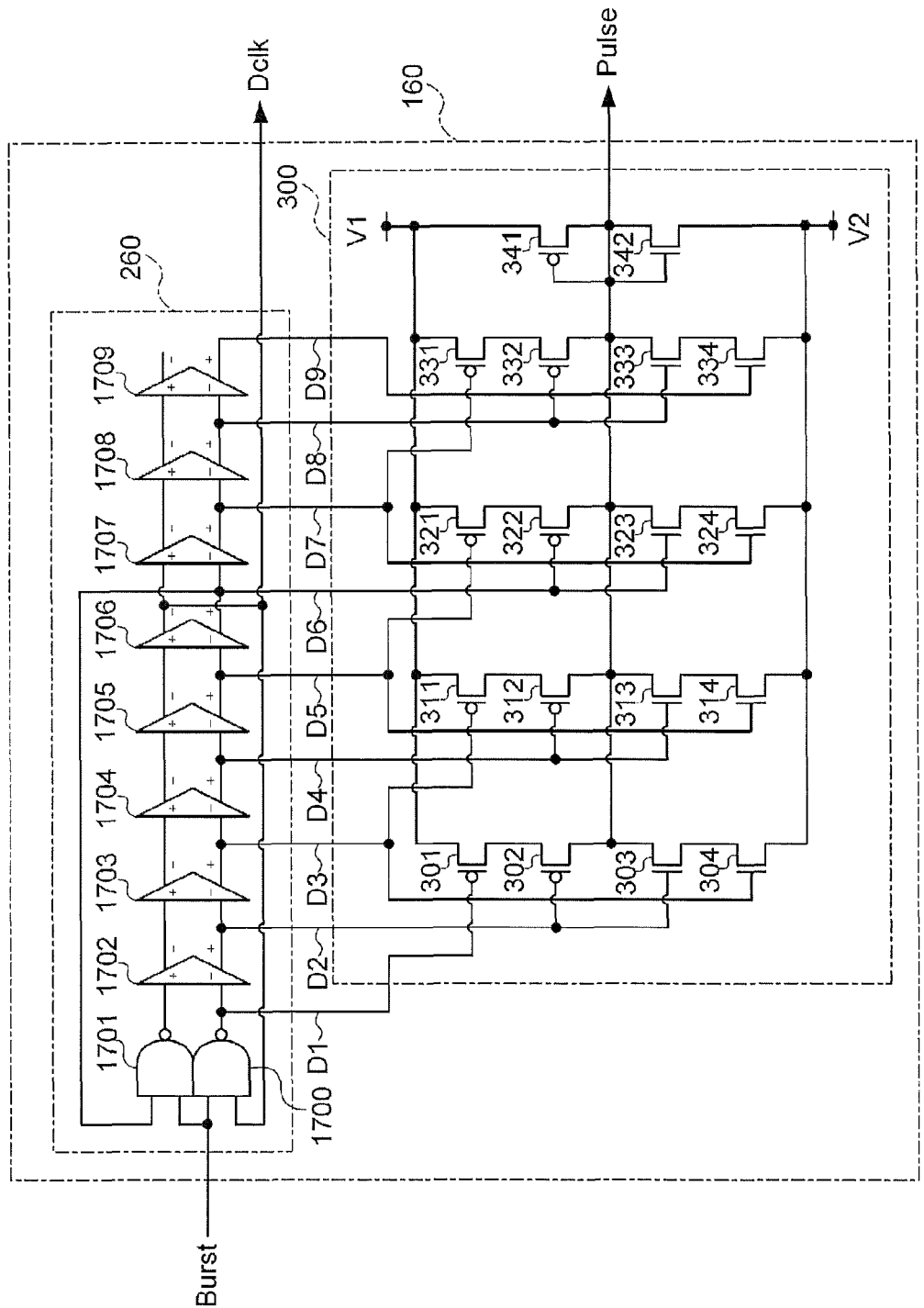
FIG. 17 is a circuit diagram showing a structure of a burst control pulse generating circuit in a modified example 2.

A burst control pulse generating circuit according to a modified example 2 is now discussed. FIG. 17 is a circuit diagram showing the structure of the burst control pulse generating circuit in the modified example 2. While the timing generating circuit 200 shown in FIG. 2 is used in the first embodiment, a timing generating circuit 260 shown in FIG.

17 may be used instead of the timing generating circuit 200. The timing generating circuit 260 has differential inverters 1702 through 1709 in FIG. 17 in lieu of the inverters 202 through 209 shown in FIG. 2, and two-input NANDs 1700 and 1701 shown in FIG. 17 in lieu of the two-input NAND 201 shown in FIG. 2. According to the modified example 2, the period of periodic signals generated by the timing generating circuit 260 can be more freely determined. Moreover, the effect of noises generated from the timing generating circuit 260 and introduced from the outside can be reduced due to the differential operation.

Modified Example 3

Figure 18:
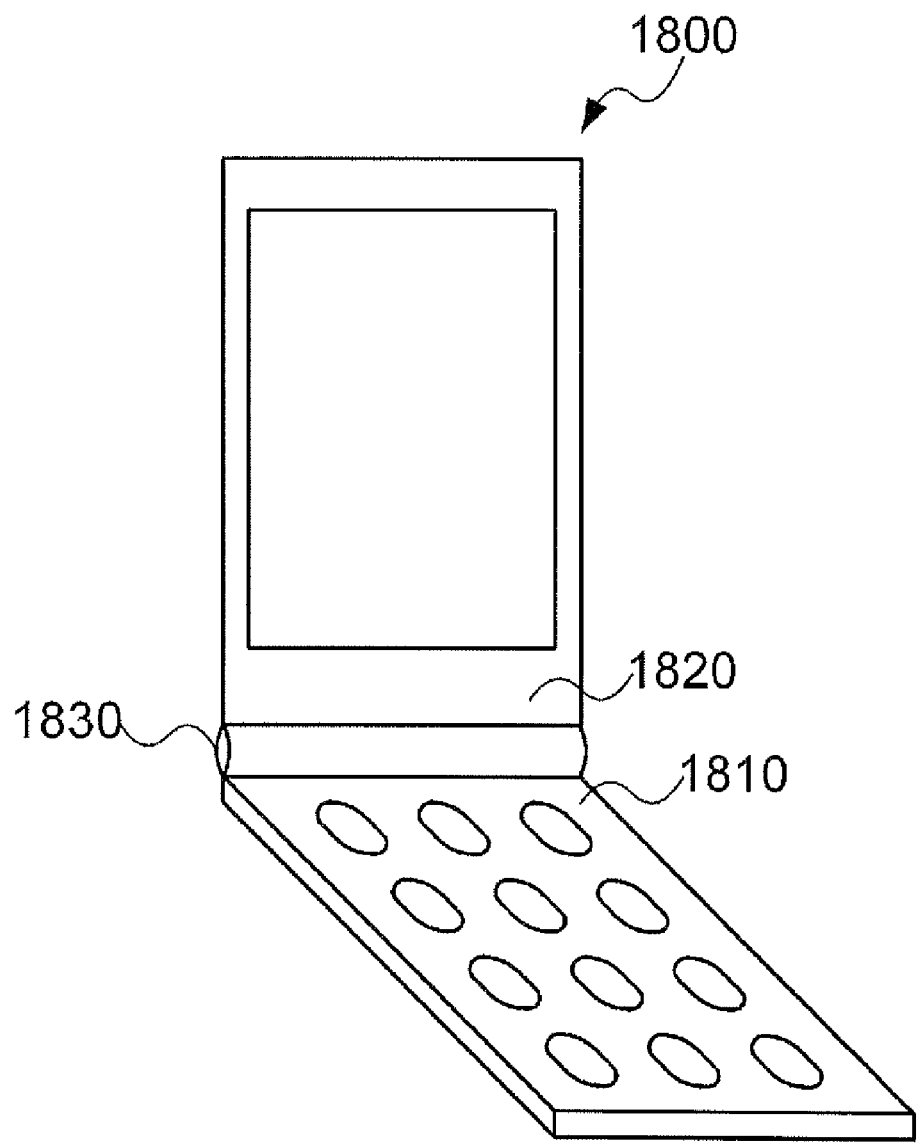
FIG. 18 is a schematic diagram showing a structure of a cellular phone as an electronic device in a modified example 3.

An example of electronic device which uses the burst control pulse generating circuit is now described. FIG. 18 schematically illustrates a structure of a cellular phone 1800 as an electronic device according to a modified example 3. A cellular phone 1800 includes a main body unit 1810 having operation buttons and the like, and a display unit 1820 having a liquid crystal panel and the like connected with the main body unit 1810 by a hinge 1830 such that the display unit 1820 can be folded. The transmitting circuit 600 shown in FIG. 12 is contained in the main body unit 1810. The receiving circuit 700 shown in FIG. 12 is contained in the display unit 1820. Data such as dynamic images, still images, and sounds is transmitted from the main body unit 1810 to the display unit 1820 by radio communication. According to the structure of the cellular phone 1800 having the transmitting circuit 600 and the receiving circuit 700, data such as dynamic images, still images, and sounds can be transferred at high speed from the main body unit 1810 to the display unit 1820.

What is claimed is:

1. A burst control pulse generating circuit which generates a pulse signal used to provide communication, comprising:
   a timing generating circuit containing a ring oscillation circuit which oscillates a periodic signal based on a burst signal for controlling an ON and OFF condition of the communication to output a plurality of timing signals based on the periodic signal; and
   a pulse generating logic circuit which generates the pulse signal based on the plural timing signals;
   wherein the burst control pulse generating circuit generates the pulse signal one or more times when the burst signal is in the ON condition, and stops generation of the pulse signal when the burst signal is in the OFF condition.

2. The burst control pulse generating circuit according to claim 1, wherein an oscillation period of the periodic signal oscillated from the ring oscillation circuit is longer than a pulse width of the pulse signal.

3. The burst control pulse generating circuit according to claim 2, wherein the ring oscillation circuit shares at least one constituent element with the timing generating circuit.

4. The burst control pulse generating circuit according to claim 2, wherein the ring oscillation circuit contains a logic circuit adapted to control the oscillation period of the periodic signal.

5. The burst control pulse generating circuit according to claim 2, wherein the timing generating circuit contains a logic circuit adapted to control the timing signals.

6. The burst control pulse generating circuit according to claim 2, wherein:
   the ring oscillation circuit contains a two-input logic circuit, and n (n≧2) NOT circuits connected in series with an output pin of the two-input logic circuit, the output pin of the nth NOT circuit being connected with one input pin of the two-input logic circuit, the burst signal being inputted to the other input pin of the two-input logic circuit; and
   the timing generating circuit contains the ring oscillation circuit, and m (m≦n) NOT circuits connected in series with an output pin of the nth NOT circuit.

7. The burst control pulse generating circuit according to claim 2, wherein:
   the ring oscillation circuit contains a two-input logic circuit, and n (n≧2) NOT circuits connected in series with the output pin of the two-input logic circuit;
   the timing generating circuit contains the ring oscillation circuit, and 2×m (m≦n÷2) NOT circuits connected in series with the output pin of the nth NOT circuit;
   a switching circuit which switches connection with the output pin of the n+(2×i)th (0≦i≦m) NOT circuit is connected with one input of the two-input logic circuit; and
   the burst signal is inputted to the other input pin of the two-input logic circuit.

8. The burst control pulse generating circuit according to claim 2, wherein:
   the ring oscillation circuit contains a two-input logic circuit, and n (n≧2) NOT circuits connected in series with the output pin of the two-input logic circuit, the output pin of the nth NOT circuit being connected with one input pin of the two-input logic circuit, the burst signal being inputted to the other input pin of the two-input logic circuit; and
   the timing generating circuit contains the ring oscillation circuit, and n+m (m≦n) delay control NOT circuits adapted to control delay time based on a delay control signal and connected in series with the output pin of the two-input logic circuit.

9. The burst control pulse generating circuit according to claim 2, wherein:
   the ring oscillation circuit contains a two-input logic circuit, n (n≧2) delay control NOT circuits adapted to control delay time based on a delay control signal and connected in series with the output pin of the two-input logic circuit, and a delay circuit, the output pin of the nth delay control NOT circuit being connected with one input pin of the two-input logic circuit via the delay circuit, the burst signal being inputted to the other input pin of the two-input logic circuit; and
   the timing generating circuit contains the ring oscillation circuit.

10. A digital modulating circuit, comprising:
    the burst control pulse generating circuit according to claim 2;
    a parallel/serial converting circuit; and
    a switching circuit which outputs the pulse signal generated from the burst control pulse generating circuit via a delay circuit when a serial signal outputted from the parallel/serial converting circuit is a first voltage, and outputs the pulse signal when the serial signal is a second voltage different from the first voltage,
    wherein the digital modulating circuit applies pulse position modulation to an inputted parallel signal and outputs the modulated parallel signal.

11. A digital modulating circuit, comprising:
    the burst control pulse generating circuit according to claim 2;
    a parallel/serial converting circuit; and
    a switching circuit which outputs the pulse signal generated from the burst control pulse generating circuit when a serial signal outputted from the parallel/serial converting circuit is a first voltage, and cuts the output of the pulse signal when the serial signal is a second voltage different from the first voltage, wherein the digital modulating circuit applies on-off keying modulation to an inputted parallel signal and outputs the modulated parallel signal.

12. A digital modulating circuit, comprising:

the burst control pulse generating circuit according to claim 2;

a parallel/serial converting circuit; and a switching circuit which outputs the pulse signal generated from the burst control pulse generating circuit via a delay circuit when a serial signal outputted from the parallel/serial converting circuit is a first voltage, and outputs the pulse signal via a NOT circuit when the serial signal is a second voltage different from the first voltage, wherein the digital modulating circuit applies bi-phase modulation to an inputted parallel signal and outputs the modulated parallel signal.

13. A digital modulating circuit, comprising:

a first burst control pulse generating circuit and a second burst control pulse generating circuit as the burst control pulse generating circuit according to claim 2;

a parallel/serial converting circuit; and a switching circuit which outputs the pulse signal generated from the first burst control pulse generating circuit when a serial signal outputted from the parallel/serial converting circuit is a first voltage, and outputs the pulse signal generated from the second burst control pulse generating circuit when the serial signal is a second voltage different from the first voltage, wherein the digital modulating circuit applies frequency shift keying modulation to an inputted parallel signal and outputs the modulated parallel signal.

14. An electronic device, comprising:

a burst control pulse generating circuit including:
  a timing generating circuit containing a ring oscillation circuit which oscillates a periodic signal based on a burst signal for controlling an ON and OFF condition of communication to output a plurality of timing signals based Ion the periodic signal, and
  a pulse generating logic circuit which generates a pulse signal used to provide communication based on the plural timing signals,
  wherein:
    the burst control pulse generating circuit generates the pulse signal one or more times when the burst signal is in the ON condition, and stops generation of the pulse signal when the burst signal is in the OFF condition, and
    the oscillation period of the periodic signal oscillated from the ring oscillation circuit is longer than a pulse width of the pulse signal;

a parallel/serial converting circuit;

a switching circuit which outputs the pulse signal generated from the burst control pulse generating circuit via a delay circuit when a serial signal outputted from the parallel/serial converting circuit is a first voltage, and outputs the pulse signal when the serial signal is a second voltage different from the first voltage;

a transmitting device containing a digital modulating circuit which applies pulse position modulation to an inputted parallel signal and outputs the modulated parallel signal; and a receiving device containing the burst control pulse generating circuit.

15. An electronic device, comprising:

a burst control pulse generating circuit including
  a timing generating circuit containing a ring oscillation circuit which oscillates a periodic signal based on a burst signal for controlling an ON and OFF condition of communication to output a plurality of timing signals based on the periodic signal, and
  a pulse generating logic circuit which generates a pulse signal used to provide communication based on the plural timing signals,
  wherein:
    the burst control pulse generating circuit generates the pulse signal one or more times when the burst signal is in the ON condition, and stops generation of the pulse signal when the burst signal is in the OFF condition, and
    the oscillation period of the periodic signal oscillated from the ring oscillation circuit is longer than a pulse width of the pulse signal;

a parallel/serial converting circuit;

a switching circuit which outputs the pulse signal generated from the burst control pulse generating circuit via a delay circuit when a serial signal outputted from the parallel/serial converting circuit is a first voltage, and outputs the pulse signal via a NOT circuit when the serial signal is a second voltage different from the first voltage;

a transmitting device containing a digital modulating circuit which applies bi-phase modulation to an inputted parallel signal and outputs the modulated parallel signal; and a receiving device containing the burst control pulse generating circuit.

16. An electronic device, comprising:

a burst control pulse generating circuit including
  a timing generating circuit containing a ring oscillation circuit which oscillates a periodic signal based on a burst signal for controlling an ON and OFF condition of communication to output a plurality of timing signals based on the periodic signal, and
  a pulse generating logic circuit which generates a pulse signal used to provide communication based on the plural timing signals,
  wherein
    the burst control pulse generating circuit generates the pulse signal one or more times when the burst signal is in the ON condition, and stops generation of the pulse signal when the burst signal is in the OFF condition, and
    the oscillation period of the periodic signal oscillated from the ring oscillation circuit is longer than a pulse width of the pulse signal;

a parallel/serial converting circuit;

a switching circuit which outputs the pulse signal generated from the burst control pulse generating circuit when a serial signal outputted from the parallel/serial converting circuit is a first voltage, and cuts the output of the pulse signal when the serial signal is a second voltage different from the first voltage;

a transmitting device containing a digital modulating circuit which applies OOK (on-off keying) modulation to an inputted parallel signal and outputs the modulated parallel signal; and a receiving device.

17. An electronic device, comprising:

a first burst control pulse generating circuit and a second burst control pulse generating circuit as a burst control pulse generating circuit including a timing generating circuit containing a ring oscillation circuit which oscillates a periodic signal based on a burst signal for controlling an ON and OFF condition of communication to output a plurality of timing signals based on the periodic signal, and a pulse generating logic circuit which generates a pulse signal used to provide communication based on the plural timing signals, wherein the burst control pulse generating circuit generates the pulse signal one or more times when the burst signal is in the ON condition, and stops generation of the pulse signal when the burst signal is in the OFF condition, and the oscillation period of the periodic signal oscillated from the ring oscillation circuit is longer than a pulse width of the pulse signal;

a parallel/serial converting circuit;

a switching circuit which outputs the pulse signal generated from the first burst control pulse generating circuit when a serial signal outputted from the parallel/serial converting circuit is a first voltage, and outputs the pulse signal generated from the second burst control pulse generating circuit when the serial signal is a second voltage different from the first voltage;

a transmitting device containing a digital modulating circuit which applies FSK (frequency shift keying) modulation to an inputted parallel signal and outputs the modulated parallel signal; and a receiving device containing the first burst control pulse generating circuit and the second burst control pulse generating circuit as the burst control pulse generating circuit.

* * * * *